US009157167B1

(12) United States Patent
Pakalapati et al.

(10) Patent No.: US 9,157,167 B1
(45) Date of Patent: *Oct. 13, 2015

(54) HIGH PRESSURE APPARATUS AND METHOD FOR NITRIDE CRYSTAL GROWTH

(75) Inventors: Rajeev T. Pakalapati, Santa Barbara, CA (US); Mark P. D'Evelyn, Santa Barbara, CA (US)

(73) Assignee: Soraa, Inc., Fremont, CA (US)

( * ) Notice: Subject to any disclaimer, the term of this patent is extended or adjusted under 35 U.S.C. 154(b) by 582 days.

This patent is subject to a terminal disclaimer.

(21) Appl. No.: 13/556,105

(22) Filed: Jul. 23, 2012

Related U.S. Application Data

(63) Continuation-in-part of application No. 13/343,563, filed on Jan. 4, 2012, now Pat. No. 8,986,447, which is a continuation of application No. 12/133,364, filed on Jun. 5, 2008, now Pat. No. 8,097,081.

(51) Int. Cl.
*C30B 7/10* (2006.01)

(52) U.S. Cl.
CPC ........................................ *C30B 7/10* (2013.01)

(58) Field of Classification Search
CPC ..................................... C30B 7/00; C30B 7/10
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,066,868 A | 1/1978 | Witkin et al. | |
| 4,350,560 A | 9/1982 | Helgeland et al. | |
| 4,430,051 A | 2/1984 | von Platen | |
| 5,098,673 A | 3/1992 | Engel et al. | |
| 5,169,486 A | 12/1992 | Young et al. | |
| 5,474,021 A | 12/1995 | Tsuno et al. | |
| 5,868,837 A | 2/1999 | DiSalvo et al. | |

(Continued)

FOREIGN PATENT DOCUMENTS

| | | |
|---|---|---|
| CN | 101061570 | 10/2007 |
| JP | 06-87691 | 3/1994 |

(Continued)

OTHER PUBLICATIONS

Communication from the Japanese Patent Office re 2011-134782 dated Dec. 26, 2014 (9 pages).

(Continued)

*Primary Examiner* — Robert M Kunemund
(74) *Attorney, Agent, or Firm* — Saul Ewing LLP

(57) ABSTRACT

A high pressure apparatus and related methods for processing supercritical fluids are disclosed. In certain embodiments, the present apparatus includes a capsule, a heater, at least one ceramic ring or multiple rings, optionally, with one or more scribe marks and/or cracks present. In certain embodiments, the apparatus has a metal sleeve containing each ceramic ring. The apparatus also has a high strength enclosure, end flanges with associated insulation, and a power control system. In certain embodiments, a high pressure apparatus is constructed such that the diametric annular gap between the outer diameter of the heater and the ceramic ring is selected to provide radial load-bearing contact above a particular temperature and pressure. In certain embodiments, the apparatus is capable of accessing pressures of 0.2 GPa to 2 GPa and temperatures of 400° C. to 1200° C.

20 Claims, 10 Drawing Sheets

(56) References Cited

U.S. PATENT DOCUMENTS

| | | |
|---|---|---|
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall |
| 7,009,215 B2 | 3/2006 | D'Evelyn et al. |
| 7,012,279 B2 | 3/2006 | Wierer Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwiliski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,211,833 B2 | 5/2007 | Slater, Jr |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,381,591 B2 | 6/2008 | Moden |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 * | 1/2012 | D'Evelyn .................. 117/68 |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 8,871,024 B2 | 10/2014 | D'Evelyn |
| 8,878,230 B2 | 11/2014 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2004/0245535 A1 | 12/2004 | D'Evelyn et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128459 A1 | 6/2005 | Zwet et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0021582 A1 | 2/2006 | Saito et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255341 A1 | 11/2006 | Pinnington et al. |

(56) References Cited

U.S. PATENT DOCUMENTS

| | | |
|---|---|---|
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto et al. |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0213593 A1 | 8/2009 | Foley et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0203514 A1 | 8/2011 | Pimputkar et al. |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |

FOREIGN PATENT DOCUMENTS

| | | |
|---|---|---|
| JP | 10-032348 | 2/1998 |
| JP | 2002-513375 | 5/2002 |
| JP | 2005-289797 | 10/2005 |
| JP | 2005-298269 | 10/2005 |
| JP | 2006-315947 | 11/2006 |
| JP | 2007-039321 | 2/2007 |
| JP | 2008-133151 | 6/2008 |
| JP | 2008-521737 | 6/2008 |
| JP | 2008-222519 | 9/2008 |
| JP | 2009-071287 | 4/2009 |
| JP | 2009-520678 | 5/2009 |
| JP | 2009-527913 | 7/2009 |
| JP | 2009-286652 | 12/2009 |
| JP | 2010-010705 | 1/2010 |
| JP | 2010-047463 | 3/2010 |
| JP | 2012-512119 | 5/2012 |
| WO | WO 2004/030061 | 4/2004 |
| WO | WO 2004/061923 | 7/2004 |
| WO | WO 2005/121415 | 12/2005 |
| WO | WO 2006/057463 | 1/2006 |
| WO | WO 2006/038467 | 4/2006 |
| WO | WO 2007/004495 | 1/2007 |
| WO | WO 2010/068916 | 6/2010 |
| WO | WO 2012/016033 | 2/2012 |

OTHER PUBLICATIONS

USPTO Notice of Allowance for U.S. Appl. No. 13/343,563 dated Dec. 17, 2014 (7 pages).

USPTO Office Action for U.S. Appl. No. 13/538,426 dated Mar. 19, 2015 (16 pages).

Copel et al., 'Surfactants in Epitaxial Growth', Physical Review Letters, Aug. 7, 1989, vol. 63, No. 6, p. 632-635.

Lu et al., 'Structure of the Cl-passivated GaAs(111) surface', Physical Review B, Nov. 15, 1998, vol. 58, No. 20, pp. 13820-13823.

Massies et al., 'Surfactant mediated epitaxial growth of InxGal—xAs on GaAs (001)', Applied Physics Letters, vol. 61, No. 1, Jul. 6, 1992, pp. 99-101.

(56) References Cited

OTHER PUBLICATIONS

Sumiya et al., 'High-pressure synthesis of high-purity diamond crystal', Diamond and Related Materials, 1996, vol. 5, pp. 1359-1365.
Communication from the Chinese Patent Office re 200980134876.2 dated Jul. 3, 2013, 14 pages.
Communication from the Polish Patent Office re P394857 dated Aug. 14, 2013, 2 pages.
USPTO Office Action for U.S. Appl. No. 12/133,365 dated Aug. 21, 2013, 29 pages.
USPTO Office Action for U.S. Appl. No. 12/334,418 dated Sep. 17, 2013, 27 pages.
USPTO Office Action for U.S. Appl. No. 12/497,969 dated Sep. 6, 2013, 21 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 13/272,981 dated Aug. 15, 2013, 13 pages.
USPTO Office Action for U.S. Appl. No. 13/472,356 dated Dec. 9, 2013 (11 pages).
USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
Altoukhov et al., 'High reflectivity airgap distributed Bragg reflectors realized by wet etching of AlInN sacrificial layers', Applied Physics Letters, vol. 95, 2009, p. 191102-1-3.
Byrappa et al., 'Handbook of Hydrothermal Technology: A Technology for Crystal Growth and Materials Processing', Noyes Publications, Park Ridge, New Jersey, 2001, pp. 94-96 and 152.
Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.
Chiang et al., 'Luminescent Properties of Cerium-Activated Garnet Series Phosphor: Structure and Temperature Effects', Journal of the Electrochemical Society, vol. 155, No. 6, 2008, pp. B517-B520.
Chiu et al., 'Synthesis and Luminescence Properties of Intensely Red-Emitting $M_5Eu(WO_4)_{4-x}(MoO_4)_x$ (M = Li, Na, K) Phosphors', Journal of the Electrochemical Society, vol. 155, No. 3, 2008, pp. J71-J78.
Choi et al., '2.51 microcavity InGaN light-emitting diodes fabricated by a selective dry-etch thinning process', Applied Physics Letters, 2007, 91(6), 061120.
Ci et al., '$Ca_{1-x}Mo_{1-y}Si_yO_4:Eu^{3+}$: A Novel Red Phosphor for White Light Emitting Diodes', Physica B, vol. 403, 2008, pp. 670-674.
D'Evelyn et al., 'Bulk GaN Crystal Growth by the High-Pressure Ammonothermal Method', Journal of Crystal Growth, vol. 300, 2007, pp. 11-16.
Dorsaz et al., 'Selective oxidation of AlInN Layers for current confinement III-nitride devices', Applied Physics Letters, vol. 87, 2005, pp. 072102.
Dwilinski et al., 'AMMONO Method of BN, AlN and GaN Synthesis and Crystal Growth', MRS Internet Journal Nitride Semiconductor Research, vol. 3, No. 25, 1998, pp. 1-5.
Dwilinski et al., 'Excellent Crystallinity of Truly Bulk Ammonothermal GaN', Journal of Crystal Growth, vol. 310, 2008, pp. 3911-3916.
Ehrentraut et al., 'The ammonothermal crystal growth of gallium nitride-A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.

Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, pp. L761-L763.
Feezell et al., 'AlGaN-Cladding-Free Nonpolar InGaN/GaN Laser Diodes', Japanese Journal of Applied Physics, vol. 46, No. 13, 2007, pp. L284-L286.
Frayssinet et al., 'Evidence of Free Carrier Concentration Gradient Along the c-Axis for Undoped GaN Single Crystals', Journal of Crystal Growth, vol. 230, 2001, pp. 442-447.
Fujito et al., 'Development of Bulk GaN Crystals and Nonpolar/Semipolar Substrates by HVPE', MRS Bulletin, May 2009, vol. 34, No. 5, pp. 313-317.
Fukuda et al., 'Prospects for the Ammonothermal Growth of Large GaN Crystal', Journal of Crystal Growth, vol. 305, 2007, pp. 304-310.
Gladkov et al., 'Effect of Fe doping on optical properties of freestanding semi-insulating HVPE GaN:Fe', Journal of Crystal Growth, 312, pp. 1205-1209.
Grzegory, 'High pressure growth of bulk GaN from Solutions in gallium', Journal of Physics Condensed Matter, vol. 13, 2001, pp. 6875-6892.
Happek, 'Development of Efficient UV-LED Phosphor Coatings for Energy Saving Solid State Lighting', University of Georgia, 2007, 22 pages.
Hashimoto et al., 'A GaN bulk crystal with improved structural quality grown by the ammonothermal method', Nature Materials, vol. 6, 2007, pp. 568-671.
Hashimoto et al., 'Ammonothermal Growth of Bulk GaN', Journal of Crystal Growth, vol. 310, 2008, pp. 3907-3910.
Hoppe et al., 'Luminescence in $Eu^{2+}$-Doped $Ba_2Si_5N_8$: Fluorescence, Thermoluminescence, and Upconversion', Journal of Physics and Chemistry of Solids, vol. 61, 2000, pp. 2001-2006.
Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.
Kim et al., 'Improved Electroluminescence on Nonpolar m-Plane InGaN/GaN Qantum Well LEDs', Rapid Research Letters, vol. 1, No. 3, 2007, pp. 125-127.
Kojima et al., 'Stimulated Emission At 474 nm From an InGaN Laser Diode Structure Grown on a (1122) GaN Substrate', Applied Physics Letters, vol. 91, 2007, pp. 251107-251107-3.
Kolis et al., 'Materials Chemistry and Bulk Crystal Growth of Group III Nitrides in Supercritical Ammonia', Material Resources Society Symposium Proceedings, vol. 495, 1998, pp. 367-372.
Kolis et al., 'Crystal Growth of Gallium Nitride in Supercritical Ammonia', Journal of Crystal Growth, vol. 222, 2001, pp. 431-434.
Kubota et al., 'Temperature Dependence of Polarized Photoluminescence From Nonpolar m-Plane InGaN Multiple Quantum Wells for Blue Laser Diodes', Applied Physics Letter, vol. 92, 2008, pp. 011920-1-011920-3.
Li et al., 'The Effect of Replacement of Sr by Ca on The Structural and Luminescence Properties of the Red-Emitting $Sr_2Si_5N_8:Eu^{2+}$ LED Conversion Phosphor', Journal of Solid State Chemistry, vol. 181, 2008, pp. 515-524.
Lide et al., 'Thermal Conductivity of Ceramics and Other Insulating Materials', CRC Handbook of Chemistry and Physics, 91st Edition, 2010-2011, pp. 12-203 and 12-204.
http://www.matbase.com/material/non-ferrous-metals/other/molybdenum/properties, Data Table for: Non-Ferrous Metals: Other Metals: Molybdenum, Mar. 28, 2011, pp. 1.
Mirwald et al., 'Low-Friction Cell for Piston-Cylinder High Pressure Apparatus', Journal of Geophysical Research, vol. 80, No. 11, 1975, pp. 1519-1525.
Motoki et al., 'Growth and Characterization of Freestanding GaN Substrates', Journal of Crystal Growth, vol. 237-239, 2002, pp. 912-921.
Moutanabbir, 'Bulk GaN Ion Cleaving', Journal of Electronic Materials, vol. 39, 2010, pp. 482-488.
Mueller-Mach et al., 'Highly Efficient All-Nitride Phosphor-Converted White Light Emitting Diode', Physica Status Solidi (a), vol. 202, 2005, pp. 1727-1732.

(56) References Cited

OTHER PUBLICATIONS

Murota et al., 'Solid State Light Source Fabricated With YAG:Ce Single Crystal', Japanese Journal of Applied Physics, vol. 41, Part 2, No. 8A, 2002, pp. L887-L888.
Okamoto et al., 'Continuous-Wave Operation of m-Plane InGaN Multiple Quantum Well Laser Diodes', Japanese Journal of Applied Physics, vol. 46, No. 9, 2007, pp. L187-L189.
Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820-L822.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Pattison et al., 'Gallium Nitride Based Microcavity Light Emitting Diodes With 2? Effective Cavity Thickness', Applied Physics Letters, vol. 90, Issue 3, 031111 (2007) 3pg.
International Search Report & Written Opinion of PCT Application No. PCT/US2009/046252, dated Jul. 29, 2009, 12 pages total.
International Search Report & Written Opinion of PCT Application No. PCT/US2009/067745, dated Feb. 5, 2010, 9 pages total.
Peters, 'Ammonothermal Synthesis of Aluminium Nitride', Journal of Crystal Growth, vol. 104, 1990, pp. 411-418.
Porowski, 'High Resistivity GaN Single Crystalline Substrates', Acta Physica Polonica A, vol. 92, No. 2, 1997, pp. 958-962.
Porowski, 'Near Defect Free GaN Substrates', Journal of Nitride Semiconductor, 1999, pp. 1-11.
Roder et al., 'Temperature dependence of the thermal expansion of GaN', Physics Review B, vol. 72., No. 085218, Aug. 24, 2005.
Sarva et al., 'Dynamic Compressive Strength of Silicon Carbide Under Uniaxial Compression', Material Sciences and Engineering, vol. A317, 2001, pp. 140-144.
Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Schmidt et al., 'Demonstration of Nonpolar m-Plane InGaN/GaN Laser Diodes', Japanese Journal of Applied Physics, vol. 46, No. 9, 2007, pp. L190-L191.
Setlur et al., 'Crystal Chemistry and Luminescence of Ce3+-Doped (Lu2CaMg2(Si,Ge)3O12 and Its Use in LED Based Lighting', Chemistry of Materials, vol. 18, 2006, pp. 3314-3322.
Sharma et al., Applied Physics Letters, vol. 87, 2005, pp. 051107.
Sizov et al., '500-nm Optical Gain Anisotropy of Semipolar (1122) InGaN Quantum Wells', Applied Physics Express, vol. 2, 2009, pp. 071001-1-071001-3.
Tsuda et al., 'Blue Laser Diodes Fabricated on m-Plane GaN Substrates', Applied Physics Express, vol. 1, 2008, pp. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, pp. L444-L445.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Wang et al., 'Ammonothermal Growth of GaN Crystals in Alkaline Solutions', Journal of Crystal Growth, vol. 287, 2006, pp. 376-380.
Wang et al., 'Ammonothermal Synthesis of III-Nitride Crystals', Crystal Growth & Design, vol. 6, No. 6, 2006, pp. 1227-1246.
Wang et al., 'Synthesis of Dense Polycrystaline GaN of High Purity by the Chemical Vapor Reaction Process', Journal of Crystal Growth, vol. 286, 2006, pp. 50-54.
Wang et al., 'New Red Y0.85Bi0.1Eu0.05V1-yMyO4 (M = Nb, P) Phosphors for Light-Emitting Diodes', Physica B, vol. 403, 2008, pp. 2071-2075.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
Yamamoto, 'White LED Phosphors: The Next Step', Proceeding of SPIE, 2010, pp. 1-10.
Yang et al., 'Preparation and luminescence properties of LED conversion novel phosphors SrZnO2:Sm', Materials Letters, vol. 62, 2008, pp. 907-910.
Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1233504-3.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/133,364 dated Nov. 26, 2010 (5 pages).
USPTO Office Action for U.S. Appl. No. 12/133,364 dated Jun. 1, 2011 (7 pages).
USPTO Notice of Allowance for U.S. Appl. No. 12/133,364 dated Oct. 11, 2011 (5 pages).
USPTO Office Action for U.S. Appl. No. 12/133,365 dated Jun. 9, 2011 (16 pages).
USPTO Office Action for U.S. Appl. No. 12/133,365 dated Oct. 18, 2011 (21 pages).
USPTO Office Action for U.S. Appl. No. 12/133,365 dated May 13, 2013 (22 pages).
USPTO Office Action for U.S. Appl. No. 12/334,418 dated Apr. 5, 2011 (19 pages).
USPTO Office Action for U.S. Appl. No. 12/334,418 dated Oct. 19, 2011 (23 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).
USPTO Notice of Allowance for U.S. Appl. No. 12/478,736 dated Oct. 9, 2012 (4 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/497,969 dated Feb. 2, 2012 (19 pages).
USPTO Office Action for U.S. Appl. No. 12/497,969 dated Jul. 5, 2012 (17 pages).
USPTO Office Action for U.S. Appl. No. 12/497,969 dated May 16, 2013 (21 pages).
USPTO Office Action for U.S. Appl. No. 12/534,838 dated May 3, 2011 (11 pages).
USPTO Office Action for U.S. Appl. No. 12/534,838 dated Jan. 13, 2012 (12 pages).
USPTO Office Action for U.S. Appl. No. 12/534,838 dated Mar. 20, 2012 (12 pages).
USPTO Notice of Allowance for U.S. Appl. No. 12/534,838 dated Jun. 8, 2012 (8 pages).
USPTO Office Action for U.S. Appl. No. 12/534,843 dated Sep. 10, 2012 (9 pages).
USPTO Notice of Allowance for U.S. Appl. No. 12/534,843 dated Jan. 24, 2013 (8 pages).
USPTO Office Action for U.S. Appl. No. 12/534,844 dated Sep. 16, 2010 (8 pages).
USPTO Office Action for U.S. Appl. No. 12/534,844 dated Feb. 4, 2011 (9 pages).
USPTO Notice of Allowance for U.S. Appl. No. 12/534,849 dated Jul. 31, 2012 (11 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).

(56) References Cited

OTHER PUBLICATIONS

USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
USPTO Office Action for U.S. Appl. No. 12/569,841 dated Dec. 23, 2011 (12 pages).
USPTO Office Action for U.S. Appl. No. 12/569,844 dated Oct. 12, 2012 (12 pages).
USPTO Office Action for U.S. Appl. No. 12/634,665 dated Apr. 25, 2012 (10 pages).
USPTO Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/636,683 dated Jun. 12, 2013 (14 pages).
USPTO Office Action for U.S. Appl. No. 12/724,983 dated Mar. 5, 2012 (20 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (20 pages).
USPTO Office Action for U.S. Appl. No. 12/891,668 dated Jan. 10, 2013 (30 pages).
USPTO Notice of Allowance for U.S. Appl. No. 12/891,668 dated Mar. 20, 2013 (13 pages).
USPTO Office Action for U.S. Appl. No. 13/013,697 dated Jun. 9, 2014 (5 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Office Action for U.S. Appl. No. 13/041,199 dated Mar. 12, 2013 (9 pages).
USPTO Office Action for U.S. Appl. No. 13/041,199 dated Apr. 29, 2014 (12 pages).
USPTO Office Action for U.S. Appl. No. 13/175,739 dated Dec. 7, 2012 (5 pages).
USPTO Notice of Allowance for U.S. Appl. No. 13/175,739 dated Mar. 21, 2013 (6 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Notice of Allowance for U.S. Appl. No. 13/226,249 dated Feb. 21, 2013 (5 pages).
USPTO Office Action for U.S. Appl. No. 13/272,981 dated Mar. 20, 2013 (18 pages).
USPTO Office Action for U.S. Appl. No. 13/346,507 dated Dec. 21, 2012 (8 pages).
USPTO Notice of Allowance for U.S. Appl. No. 13/346,507 dated Apr. 22, 2013 (8 pages).
USPTO Notice of Allowance for U.S. Appl. No. 13/425,304 dated Aug. 22, 2012 (7 pages).
USPTO Notice of Allowance for U.S. Appl. No. 13/548,931 dated Jun. 3, 2013 (10 pages).
Communication from the Chinese Patent Office re 200980154756.9 dated Jun. 17, 2014 (10 pages).
USPTO Office Action for U.S. Appl. No. 12/484,095 dated Aug. 29, 2014 (10 pages).
USPTO Notice of Allowance for U.S. Appl. No. 13/013,697 dated Aug. 27, 2014 (5 pages).
USPTO Notice of Allowance for U.S. Appl. No. 13/041,199 dated Sep. 9, 2014 (9 pages).
USPTO Office Action for U.S. Appl. No. 13/160,307 dated Jun. 26, 2014 (19 pages).
USPTO Office Action for U.S. Appl. No. 13/894,220 dated Jul. 31, 2014 (9 pages).
Amano et al., 'Metalorganic Vapor Phase Epitaxial Growth of a High Quality GaN Film Using an AlN Buffer Layer', Applied Physics Letter, vol. 48, No. 5, 1986, pp. 353-355.
Baker et al., 'Characterization of Planar Semipolar Gallium Nitride Films on Spinel Substrates', Japanese Journal of Applied Physics, vol. 44, No. 29, 2005, pp. L920-L922.
Baker et al., 'Characterization of Planar Semipolar Gallium Nitride Films on Sapphire Substrates', Japanese Journal of Applied Physics, vol. 45, No. 6, 2006, pp. L154-L157.
Cantu et al., 'Si Doping Effect on Strain Reduction in Compressively Strained Al0.49Ga0.51N Thin Films', Applied Physics Letter, vol. 83, No. 4, 2003, pp. 674-676.
Chakraborty et al., 'Defect Reduction in Nonpolar a-Plane GaN Films Using in situ SiNx Nanomask', Applied Physics Letters, vol. 89, 2006, pp. 041903-1-041903-3.
Corrion et al., 'Structural and Morphological Properties of GaN Buffer Layers Grown by Ammonia Molecular Beam Epitaxy on SiC Substrates for AlGaN/GaN High Electron Mobility Transistors', Journal of Applied Physics, vol. 103, No. 9, 2008, pp. 093529-1-093529-7.
Davidsson et al., 'Effect of AlN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.
Grandjean et al., 'Nitridation of Sapphire. Effect on the Optical Properties of GaN Epitaxial Overlayers', Applied Physics Letters, vol. 69, No. 14, 1996, pp. 2071-2073.
Green et al., 'Polarity Control During Molecular Beam Epitaxy Growth of Mg-Doped GaN', Journal of Vacuum Science Technology, vol. B-21, No. 4, 2003, pp. 1804-1811.
Hellman, 'The Polarity of GaN: A Critical Review', MRS Internet Journal Nitride Semiconductor Research, vol. 3, No. 11, 1998, pp. 1-11.
Heying et al., 'Control of GaN Surface Morphologies Using Plasma-Assisted Molecular Beam Epitaxy', Journal of Applied Physics, vol. 88, No. 4, 2000, pp. 1855-1860.
Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.
Keller et al., 'Influence of Sapphire Nitridation on Properties of Gallium Nitride Grown by Metalorganic Chemical Vapor Deposition', Applied Physics Letters, vol. 68, No. 11, 1996, pp. 1525-1527.
Keller et al., 'Influence of the Substrate Misorientation on the Properties of N-Polar GaN Films Grown by Metal Organic Chemical Vapor Deposition', Journal of Applied Physics, vol. 102, 2007, pp. 083546-1-083546-6.
Koblmuller et al., 'In Situ Investigation of Growth Modes During Plasma-Assisted Molecular Beam Epitaxy of (0001) GaN', Applied Physics Letters, vol. 91, 2007, pp. 161904-1-161904-3.

(56) References Cited

OTHER PUBLICATIONS

Koblmuller et al., 'High Electron Mobility GaN Grown Under N-Rich Conditions by Plasma-Assisted Molecular Beam Epitaxy', Applied Physics Letters, vol. 91, 2007, pp. 221905-1-221905-3.

Manfra et al., 'Dislocation and Morphology Control During Molecular-Beam Epitaxy of AlGaN/GaN Heterostructures Directly on Sapphire Substrates', Applied Physics Letters, vol. 81, No. 8, 2002, pp. 1456-1458.

Marchand et al., 'Microsructure of GaN Laterally Overgrown by Metalorganic Chemical Vapor Deposition', Applied Physics Letters, vol. 73, No. 6, 1998, pp. 747-749.

Nakamura et al., 'GaN Growth Using GaN Buffer Layer', Japanese Journal of Applied Physics, vol. 30, No. 10A, 1991, pp. L1705-L1707.

Park et al., 'Selective-Area and Lateral Epitaxial Overgrowth of III-N Materials by Metal Organic Chemical Vapor Deposition', Applied Physics Letters, vol. 73, No. 3, 1998, pp. 333-335.

International Search Report of PCT Application No. PCT/US2009/048489, dated Sep. 14, 2009, 12 pages total.

International Search Report of PCT Application No. PCT/US2009/049725, dated Sep. 1, 2009, 17 pages total.

International Search Report & Written Opinion of PCT Application No. PCT/US2009/054952, dated Oct. 21, 2009, 15 pages total.

International Search Report & Written Opinion of PCT Application No. PCT/US2009/056546, dated Nov. 2, 2009, 13 pages total.

International Search Report & Written Opinion of PCT Application No. PCT/US2010/052175, dated Jan. 6, 2011, 3 total pages.

Romanov et al., 'Stress Relaxation in Mismatched Layers Due to Threading Dislocation Inclination', Applied Physics Letter, vol. 83, No. 13, 2003, pp. 2569-2571.

Stutzmann et al., 'Playing With Polarity', Physics Status Solidi, vol. 228, No. 2, 2001, pp. 505-512.

Sumiya et al., 'Growth Mode and Surface Morphology of a GaN Film Deposited Along the N-Face Polar Direction on c-Plane Sapphire Substrate', Journal of Applied Physics, vol. 88, No. 2, 2000, pp. 1158-1165.

Sumiya et al., 'Review of Polarity Determination and Control of GaN', MRS Internet Journal Nitride Semiconductor Research, vol. 9, No. 1, 2004, pp. 1-34.

Communication from the Japanese Patent Office re 2011-053647 dated Sep. 17, 2014 (8 pages).

Waltereit et al., 'Structural Properties of GaN Buffer Layers on 4H-SiC(0001) Grown by Plasma-Assisted Molecular Beam Epitaxy for High Electron Mobilty Transistors', Japanese Journal of Applied Physics, vol. 43, No. 12-A, 2004, pp. L1520-L1523.

Weyher et al., 'Morphological and Structural Characteristics of Homoepitaxial GaN Grown by Metalorganic Chemical Vapour Deposition (MOCVD)', Journal of Crystal Growth, vol. 204, 1999, pp. 419-428.

Xu et al., 'Polarity Control of GaN Grown on Sapphire Substrate by RF-MBE', Journal of Crystal Growth, vol. 237-239, Pt. 2, 2002, pp. 1003-1007.

USPTO Office Action for U.S. Appl. No. 12/636,683 dated Nov. 17, 2014 (16 pages).

USPTO Office Action for U.S. Appl. No. 12/988,772 dated Dec. 5, 2014 (10 pages).

USPTO Office Action for U.S. Appl. No. 13/343,563 dated Oct. 8, 2014 (5 pages).

USPTO Office Action for U.S. Appl. No. 13/538,426 dated Nov. 21, 2014 (15 pages).

USPTO Notice of Allowance for U.S. Appl. No. 13/894,220 dated Dec. 9, 2014 (8 pages).

\* cited by examiner

HIGH PRESSURE APPARATUS AND METHOD FOR NITRIDE CRYSTAL GROWTH

CROSS-REFERENCES TO RELATED APPLICATIONS

This application is a continuation-in-part of U.S. application Ser. No. 13/343,563, filed on Jan. 4, 2012, now U.S. Pat. No. 8,986,447, which is a continuation of U.S. application Ser. No. 12/133,364 filed on Jun. 5, 2008, issued as U.S. Pat. No. 8,097,081, each of which is incorporated by reference herein in its entirety.

FIELD

The disclosure relates to high pressure apparatus and related methods for processing supercritical fluids. In certain embodiments, the present apparatus includes a capsule, a heater, at least one ceramic ring or multiple rings, optionally, with one or more scribe marks and/or cracks present. In certain embodiments, the apparatus has a metal sleeve containing each ceramic ring. The apparatus also has a high strength enclosure, end flanges with associated insulation, and a power control system. In certain embodiments, a high pressure apparatus is constructed such that the diametric annular gap between the outer diameter of the heater and the ceramic ring is selected to provide radial load-bearing contact above a particular temperature and pressure. In certain embodiments, the apparatus is capable of accessing pressures of 0.2 GPa to 2 GPa and temperatures of 400° C. to 1200° C.

BACKGROUND OF THE DISCLOSURE

The present disclosure relates generally to techniques for processing materials in supercritical fluids. More specifically, embodiments of the disclosure include techniques for controlling parameters associated with a material processing a capsule disposed within a high pressure apparatus enclosure. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, integrated circuits, and transistors, among other devices.

Supercritical fluids are used to process a wide variety of materials. A supercritical fluid is often defined as a substance beyond its critical point, i.e., critical temperature and critical pressure. A critical point represents the highest temperature and pressure at which the substance can exist as a vapor and liquid in equilibrium. In certain supercritical fluid applications, the materials being processed are placed inside a pressure vessel or other high pressure apparatus. In some cases it is desirable to first place the materials inside a container, liner, or capsule, which in turn is placed inside the high pressure apparatus. In operation, the high pressure apparatus provides structural support for the high pressures generated within the container or capsule holding the materials. The container, liner, or capsule provides a closed/sealed environment that is chemically inert and impermeable to solvents, solutes, and gases that may be involved in or generated by the process.

Scientists and engineers have been synthesizing crystalline materials using high pressure techniques. As an example, synthetic diamonds are often made using high pressure and temperature conditions. Synthetic diamonds are often used for industrial purposes but can also be grown large enough for jewelry and other applications. Scientists and engineers also use high pressure to synthesize complex materials such as zeolites, which can be used to filter toxins and the like. Moreover, geologists have also used high pressure techniques to simulate conditions and/or processes occurring deep within the earth's crust. High pressure techniques often rely upon supercritical fluids, herein referred to as SCFs.

Supercritical fluids provide an especially ideal environment for growth of high quality crystals in large volumes and low costs. In many cases, supercritical fluids possess the solvating capabilities of a liquid with the transport characteristics of a gas. Thus, on the one hand, supercritical fluids can dissolve significant quantities of a solute for recrystallization. On the other hand, the favorable transport characteristics include a high diffusion coefficient, so that solutes may be transported rapidly through the boundary layer between the bulk of the supercritical fluid and a growing crystal, and also a low viscosity, so that the boundary layer is very thin and small temperature gradients can cause facile self-convection and self-stirring of the reactor. This combination of characteristics enables, for example, the growth of hundreds or thousands of large α-quartz crystals in a single growth run in supercritical water.

Supercritical fluids also provide an attractive medium for synthesis of exotic materials, such as zeolites, for solvent extractions, as of caffeine from coffee, and for decomposition and/or dissolution of materials that are relatively inert under more typical conditions, such as biofuels and toxic waste materials.

In some applications, such as crystal growth, the pressure vessel or capsule also includes a baffle plate that separates the interior into different chambers, e.g., a top half and a bottom half. The baffle plate typically has a plurality of random or regularly spaced holes to enable fluid flow and heat and mass transfer between these different chambers, which hold the different materials being processed along with a supercritical fluid. For example, in typical crystal growth applications, one portion of the capsule contains seed crystals and the other half contains nutrient material. In addition to the materials being processed, the capsule contains a solid or liquid that forms the supercritical fluid at elevated temperatures and pressures and, typically, also a mineralizer to increase the solubility of the materials being processed in the supercritical fluid. In other applications, for example, synthesis of zeolites or of nanoparticles or processing of ceramics, no baffle plate may be used for operation. In operation, the capsule is heated and pressurized toward or beyond the critical point, thereby causing the solid and/or liquid to transform into the supercritical fluid. In some applications the fluid may remain subcritical, that is, the pressure or temperature may be less than the critical point. However, in all cases of interest here, the fluid is superheated, that is, the temperature is higher than the boiling point of the fluid at atmospheric pressure. The term "supercritical" will be used throughout to mean "superheated", regardless of whether the pressure and temperature are greater than the critical point, which may not be known for a particular fluid composition with dissolved solutes.

Although somewhat effective for conventional crystal growth, drawbacks exist with conventional processing vessels. As an example, processing capabilities for conventional steel hot-wall pressure vessels (e.g., autoclaves) are typically limited to a maximum temperature of about 400 Degrees Celsius and a maximum pressure of 0.2 GigaPascals (GPa). Fabrication of conventional pressure vessels from nickel-based superalloys allows for operation at a maximum temperature of about 550 degrees Celsius and a maximum pressure of about 0.5 GPa. Therefore, these conventional hot-wall pressure vessels are often inadequate for some processes, such as the growth of gallium nitride crystals in supercritical ammonia that often require pressures and temperatures that extend significantly above this range in order to achieve growth rates above about 2-4 microns per hour. In addition, nickel-based superalloys are very expensive and are difficult to machine, limiting the maximum practical size and greatly increasing the cost compared to traditional steel pressure vessels.

Attempts have been made to overcome the drawbacks of conventional pressure vessels. D'Evelyn et al., U.S. Publication No. 2003/0140845A1, indicates a so-called zero-stroke high pressure apparatus adapted from the type of belt apparatus used for synthesis of diamond using high pressure and high temperature. Cemented tungsten carbide, however, is used as the die material, which is relatively expensive and is difficult to manufacture in large dimensions. In addition, the use of a hydraulic press to contain the apparatus increases the cost and further limits the maximum volume. Finally, the use of a pressure transmission medium surrounding the capsule used to contain the supercritical fluid reduces the volume available within the hot zone for processing material.

D'Evelyn et al., U.S. Publication No. 2006/0177362A1, indicates several types of apparatus with capability for pressures and temperatures well in excess of that of conventional autoclaves and with improved scalability relative to the zero-stroke press apparatus described above. A series of wedge-shaped radial ceramic segments are placed between a heater which surrounds a capsule and a high strength enclosure, in order to reduce both the pressure and temperature to which the inner diameter of the high strength enclosure is exposed compared to the corresponding values for the capsule. Fabrication and use of these ceramic wedge-shaped radial segments, however, can be difficult and expensive. These and other limitations of conventional apparatus may be described throughout the present specification.

From the above, it is seen that techniques for improving a high pressure apparatus for crystal growth is highly desirable.

BRIEF SUMMARY OF THE DISCLOSURE

According to the present disclosure, techniques related for processing materials in supercritical fluids are provided. More specifically, embodiments of the disclosure include techniques for controlling parameters associated with a material processing capsule disposed within a high pressure apparatus/enclosure. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

In a specific embodiment, the present disclosure provides a high pressure apparatus and related methods for processing supercritical fluids. In a specific embodiment, the present apparatus includes a capsule, a heater, at least one ring (e.g., ceramic) but can be multiple rings, optionally, with one or more scribe marks and/or cracks present. In a specific embodiment, the apparatus optionally has a metal sleeve containing each ceramic ring. The apparatus also has a high strength enclosure, end flanges with associated insulation, and a power control system. The apparatus is scalable up to very large volumes and is cost effective. In a specific embodiment, the apparatus is capable of accessing pressures and temperatures of 0.2-2 GPa and 400-1200° C., respectively. As used herein in a specific embodiment, the term "high strength" generally means suitable mechanical and other features (e.g., tensile strength, Young's Modulus, yield strength, toughness, creep resistance, chemical resistance) that allow for use as a high pressure enclosure, such as a pressure vessel, which may be airtight, but may also not be air and/or gas tight). As an example, the term "high pressure" generally refers to above 0.1 GPa, 0.2 GPa, 0.5 GPa, and others, particularly in pressures suitable for growth of crystalline materials, including but not limited to GaN, AlN, InN, AlGaN, InGaN, AlInGaN, and other nitrides or oxides or metal or dielectric or semiconducting materials. In a specific embodiment, the high strength enclosure material is provided to form a high strength enclosure configured to withstand a load of not less than about 0.1 GPa (or 0.2 GPa or 0.5 GPa) for a predetermined time period at a temperature of about 200 Degrees Celsius or less.

In an alternative specific embodiment, the present disclosure provides apparatus for high pressure crystal or material processing, e.g., GaN, AlN, InN, InGaN, AlGaN, and AlInGaN. The apparatus includes a capsule (e.g., capsule) region comprising a first region and a second region, and a length defined between the first region and the second region. The apparatus has an annular heating member enclosing the capsule region. The apparatus has at least one (for example, two or more) continuous annular ceramic (or metal or cermet) member having a predetermined thickness are arranged sequentially and disposed continuously around a perimeter of the annular heating member. In a certain embodiment, the continuous annular members are made of a material having a compressive strength of about 0.5 GPa and greater and a thermal conductivity of about 4 watts per meter-Kelvin and less. In a specific embodiment, two or more irregularly shaped surface regions are spatially disposed within one or more of the annular members and paired to substantially mate with each other along a portion of a common boundary region. The apparatus also has a high strength enclosure material disposed overlying the annular ceramic member to form a high strength enclosure.

Still further, the present disclosure provides a method of crystal growth, e.g., GaN, AlN, InN, InGaN, AlGaN, and AlInGaN. The method includes providing an apparatus for high pressure crystal growth or material processing. The apparatus includes a capsule region (for example, cylindrical in shape) comprising a first region and a second region, and a length defined between the first region and the second region. The apparatus also has an annular heating member enclosing the capsule region. The apparatus has at least one continuous ceramic or annular metal or cermet member having a predetermined thickness disposed continuously around a perimeter of the annular heating member. In a certain embodiment, the continuous annular member is made of a material having a compressive strength of about 0.5 GPa and greater and a thermal conductivity of about 4 watts per meter-Kelvin and less. The apparatus also has a high strength enclosure material disposed overlying the annular ceramic member. In a specific embodiment, the method also includes providing a capsule containing a solvent and placing the capsule within an interior region of the capsule region. In a specific embodiment, the method includes processing the capsule with thermal energy to cause an increase in temperature within the capsule to greater than 200 Degrees Celsius to cause the solvent to be superheated.

Moreover, depending upon the embodiment, the present method can also include one of a plurality of optional steps. Optionally, the method includes forming a crystalline material from a process of the superheated solvent. Additionally, the method includes removing thermal energy from the capsule to cause a temperature of the capsule to change from a first temperature to a second temperature, which is lower than the first temperature. The method also includes removing a first flange and a second flange from the high pressure apparatus and moving a mechanical member, using a hydraulic drive force, from the first region of the capsule region toward the second region to transfer the capsule out of the capsule region. In a certain embodiment, the present apparatus can be scaled up in size to a capsule volume of 0.3 liters, to about 300 liters and greater.

Still further, the present disclosure provides a process of forming a crystalline material, e.g., GaN. The method includes providing an apparatus for high pressure crystal or material processing. The apparatus includes a capsule region comprising a first region and a second region, and a length defined between the first region and the second region. The apparatus also has an annular heating member enclosing the capsule region. At least one continuous annular member is included. The annular member includes a predetermined thickness disposed continuously around a perimeter of the annular heating member. In a specific embodiment, the continuous annular member is made of a material having a compressive strength of about 0.5 GPa and greater and a thermal conductivity of about 100 watts per meter-Kelvin and less. The apparatus also has a high strength enclosure material disposed overlying the annular member to form a high strength enclosure. The method includes providing a capsule containing a solvent and placing the capsule within an interior region of the capsule region. The method includes processing the capsule with thermal energy to cause an increase in temperature within the capsule to greater than 200 Degrees Celsius to cause the solvent to be superheated.

Benefits are achieved over pre-existing techniques using the present disclosure. In particular, the present disclosure enables a cost-effective high pressure apparatus for growth of crystals such as GaN, AlN, InN, InGaN, and AlInGaN and others. In a specific embodiment, the present method and apparatus can operate with components that are relatively simple and cost effective to manufacture, such as ceramic and steel tubes. A specific embodiment also takes advantage of the one or more cracks provided in the ceramic member, which insulates the heater.

Depending upon the embodiment, the present apparatus and method can be manufactured using conventional materials and/or methods according to one of ordinary skill in the art. The present apparatus and method enable cost-effective crystal growth and materials processing under extreme pressure and temperature conditions in batch volumes larger than 0.3 liters, larger than 1 liter, larger than 3 liters, larger than 10 liters, larger than 30 liters, larger than 100 liters, and larger than 300 liters according to a specific embodiment. In a certain embodiment, the present apparatus and related methods provides for selected dimensions and parameters that are important for scale up of a larger gallium nitride reactor, which has not been achieved using conventional techniques. Depending upon the embodiment, one or more of these benefits may be achieved. These and other benefits may be described throughout the present specification and more particularly below.

The present disclosure achieves these benefits and others in the context of known process technology. However, a further understanding of the nature and advantages of the present disclosure may be realized by reference to the latter portions of the specification and attached drawings.

DETAILED DESCRIPTION OF THE DISCLOSURE

According to the present disclosure, techniques for processing materials in supercritical fluids are included. More specifically, embodiments of the disclosure include techniques for controlling parameters associated with a material processing capsule disposed within a high pressure apparatus/enclosure. Merely by way of example, the disclosure can be applied to growing crystals of GaN, AlN, InN, InGaN, AlGaN, and AlInGaN for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors.

In a specific embodiment, the present disclosure provides a high pressure apparatus for processing materials. Depending upon the embodiment, the apparatus has been described with reference to a specific orientation relative to the direction of gravity. As an example, the apparatus is described as being vertically oriented. In another embodiment, the apparatus is instead horizontally oriented or oriented at an oblique angle intermediate between vertical and horizontal, and may be rocked so as to facilitate convection of the supercritical fluid within the capsule.

Figure 1:
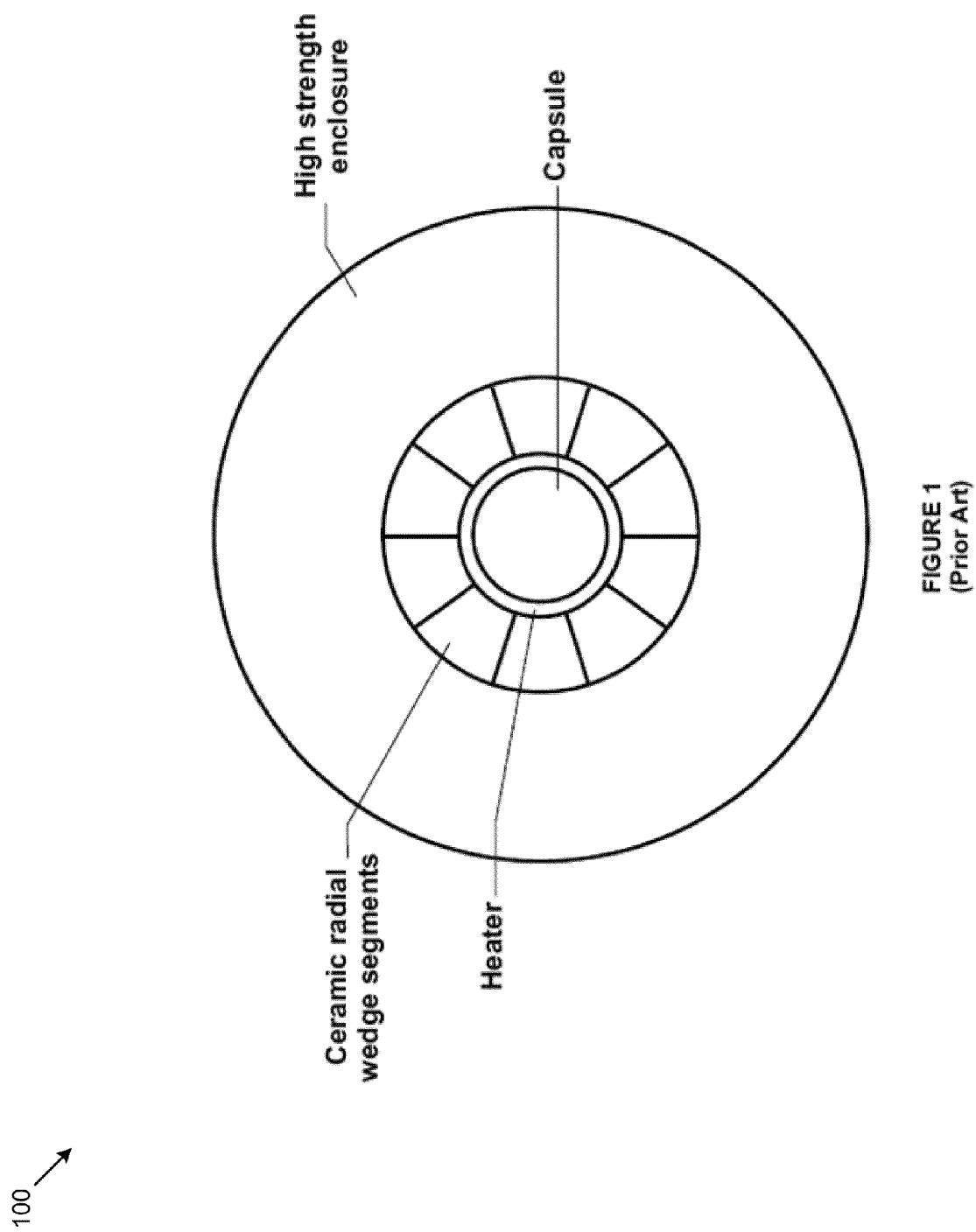
FIG. 1 is a simplified diagram of a cross-sectional view of a conventional apparatus.

To provide a point of reference, the force-wedge apparatus described by D'Evelyn et al. in U.S. Publication No. 2006/0177362A1, which is incorporated by reference herein in its entirety, is shown in FIG. 1. As shown in FIG. 1, the force-wedge apparatus includes an inner capsule surrounded by a heater, ceramic radial wedge segments, and a high strength enclosure. A capsule, such as described in U.S. Pat. No. 7,125,453, is placed within a heater, such as that described in U.S. Publication No. 2008/0083741A1, each of which is incorporated by reference herein. Both are contained within a high strength enclosure, which may be fabricated from SA 723 pressure vessel steel. Then from paragraph 51, "The process . . . includes disposing a plurality of radial segments between the high strength enclosure and the capsule [ . . . ]. These radial segments are disposed one after another around a circumference of the capsule, such that each radial segment is a wedge-shaped portion of a segmented cylinder. The radial segment may comprise a ceramic, such as alumina, silicon nitride, silicon carbide, zirconia, or the like. The radial segment may alternatively comprise a refractory metal, such as tungsten, molybdenum, or TZM alloy, or a cermet, such as Co-cemented tungsten carbide." As noted, limitations exist with the conventional force wedge apparatus. That is, it is expensive to fabricate an apparatus with a large number of the radial segments. In addition, it is difficult to fabricate each of the radial segments accurately and to assemble them into the apparatus. It was discovered that providing one or more cracks in the radial segments does not detract from their performance, as long as the cracks do not form an interconnected network. Allowing for or deliberately introducing one or more cracks into the segments allows fabrication of the apparatus with a smaller number of segments. In addition, allowing for the presence of one or more cracks in the segments may reduce the manufacturing cost of the segments, as small flaws in the ceramic parts that might grow into cracks can now be tolerated.

Figure 2:
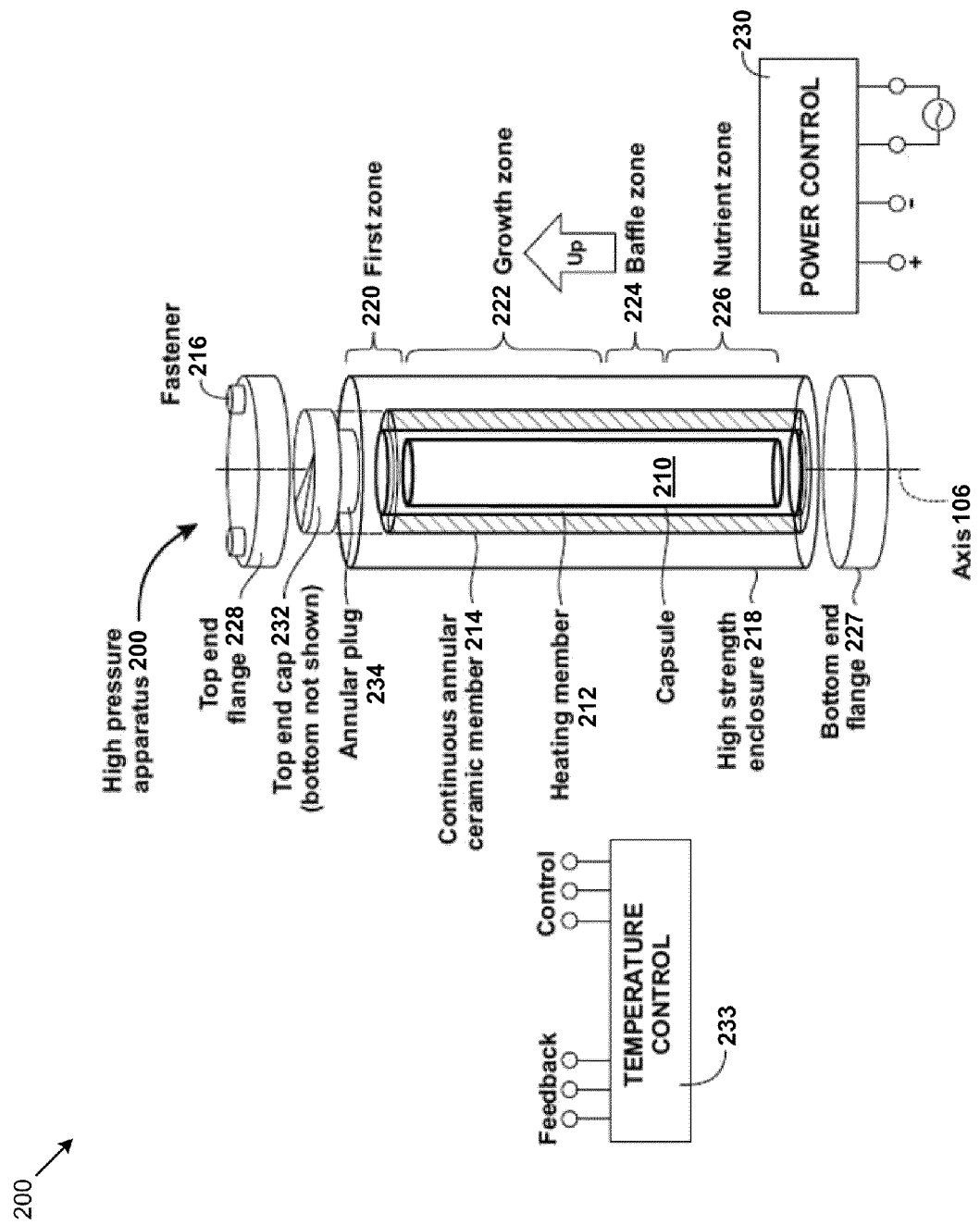
FIG. 2 is a simplified diagram of a high pressure apparatus according to an embodiment of the present disclosure.

FIG. 2 is a simplified diagram of a high pressure apparatus according to an embodiment of the present disclosure. As shown, the present disclosure provides an apparatus for high pressure crystal or material processing, e.g., GaN, AlN, InN, InGaN, AlGaN, and AlInGaN. Other processing methods include hydrothermal crystal growth of oxides and other crystalline materials, hydrothermal or ammonothermal syntheses, and hydrothermal decomposition, and others.

Referring to FIG. 2, high pressure apparatus 200 and related methods for processing supercritical fluids are disclosed. In a specific embodiment, the present high pressure apparatus 200 includes a capsule 210, a heating member or heater 212, at least one ceramic ring (e.g., continuous annular ceramic member 214) but can be multiple rings, optionally, with one or more scribe marks and/or cracks present. In a specific embodiment, the apparatus optionally has one or more metal sleeves (not shown) containing each ceramic ring. The apparatus also has a high strength enclosure 218, end flanges (e.g., top end flange 228, and bottom end flange 227) with associated insulation, and a power control system 230. The apparatus is scalable up to very large volumes and is cost effective. In a specific embodiment, the apparatus is capable of accessing pressures and temperatures of 0.2-2 GPa and 400-1200° C., respectively. In a specific embodiment, the apparatus also includes a temperature controller 233.

In a specific embodiment, high pressure apparatus 200 comprises at least one heat zone and optionally more heat zones, such as multiple, including two or more. The heat zones include an uppermost first zone 220, a growth zone 222, a baffle zone 224, and a charge or nutrient zone 226 according to a specific embodiment. When a capsule is inserted into the volume defined by a heater inner surface, an internal baffle (not shown) aligns with the baffle gap zone according to a specific embodiment. The baffle defines two chambers inside the capsule, one for nutrient and one for growth according to a specific embodiment. The two chambers communicate through the perforated baffle, which can have various shapes and configurations. In the illustrated embodiment, appropriate for crystal growth when the solubility of the material to be recrystallized is an increasing function of temperature, the growth zone is located above the nutrient zone. In other embodiments, appropriate for crystal growth when the solubility of the material to be recrystallized is a decreasing function of temperature, i.e., retrograde solubility, the growth zone is located below the nutrient zone. In still other embodiments, high pressure apparatus 200 is approximately horizontal rather than vertical and may be fitted with a rocking mechanism (not shown).

In an embodiment, the capsule suitable for insertion inside the heater is formed from a precious metal. Examples of precious metals include platinum, palladium, rhodium, gold, and silver. Other metals can include titanium, rhenium, copper, stainless steel, zirconium, tantalum, alloys thereof, and the like. In an embodiment, the metal functions as an oxygen getter. Suitable capsule dimensions may be greater than 2 cm in diameter and 4 cm in length. In certain embodiments, the dimension of the diameter is in a range selected from any of: 2-4 cm, 4-8 cm, 8-12 cm, 12-16 cm, 16-20 cm, 20-24 cm, and greater than 24 cm. In certain embodiments, the ratio of the length to diameter of the capsule is greater than 2. In certain embodiments, the ratio of length to diameter is in a range of any of: 2 to 4, 4 to 6, 6 to 8, 8 to 9, 9 to 10, 10 to 11, 11 to 12, 12 to 14, 14 to 16, 16 to 18, 18 to 20, and greater than 20.

In an embodiment, the growth zone 222 volume has twice the charge or nutrient zone 226 volume. The electrical circuits for each heating element segment are independently controlled. Independent control provides flexibility to achieve and maintain a heat deposition profile along the capsule height. A physical discontinuity between the second and third heater segments, from the top, produces a local dip in temperature near a baffle plate disposed in the capsule and separating the charge or nutrient zone 226 from the growth zone 222. In an embodiment, the charge zone and the growth zone are isotherms at temperatures that differ from each other. The baffle zone has a temperature gradient over a relatively small distance between the charge zone and the growth zone isotherms. The winding patterns of the heating elements and the resultant isotherms with minimal temperature gradient spacing therebetween minimize or eliminate wall nucleation inside the capsule and in or on the baffle. In an embodiment, the growth zone may be at the bottom and the charge zone at the top. Such configurations may be based on specific chemistries and growth parameters.

With particular reference to FIG. 2, the heating member 212 is disposed in a high pressure apparatus 200 that includes a vessel or high strength enclosure 218. Attachable to the top end of the vessel is first flange (e.g., top end flange 228), and to the bottom end is a second flange (e.g., bottom end flange 227). A plurality of fasteners 216 (only one of which is indicated with a reference number) secure the end flanges to the vessel ends.

Within the high-strength enclosure 218, continuous annular ceramic member 214 lines the vessel inner surface and contacts the outer surface of the heater 212. Examples of annular ceramic member materials include but are not limited to zirconium oxide or zirconia. First and second end caps 232 (only one of which is shown) are located proximate to the ends of the heater 212 inside the vessel. An annular plug 234 is shown as stacked disks, but may be an annulus surrounding the cap 232. The plug 234 optionally can be disposed on at least one end and within a cavity between the capsule and the end flange to reduce axial heat loss and may comprise zirconium oxide or zirconia. Alternative plug materials may include magnesium oxide, salts, and phyllosilicate minerals such as aluminum silicate hydroxide or pyrophyllite according to a specific embodiment.

High pressure apparatus 200 may include a pressure transmission medium between the axial ends (See reference numeral 106) of the capsule and the end caps and/or annular plugs according to a specific embodiment. The pressure transmission medium may comprise sodium chloride, other salts, or phyllosilicate minerals such as aluminum silicate hydroxide or pyrophyllite or other materials according to a specific embodiment. However, notwithstanding the optional presence of a coating or foil to decrease friction and promote the sliding removal of the capsule after operation, the interface between the outer diameter of the capsule and the inner diameter of the heating member may be substantially free of pressure transmission medium. In addition, the interface between the outer diameter of the heating member and the inner diameter of the continuous annular ring is substantially free of pressure transmission medium.

The illustrated high pressure apparatus 200 can be used to grow crystals under pressure and temperature conditions desirable for crystal growth, e.g., gallium nitride crystals under related process conditions. The high pressure apparatus 200 can include one or more structures operable to support the heater 212 radially, axially, or both radially and axially. The support structure in one embodiment thermally insulates the high pressure apparatus 200 from the ambient environment, and such insulation may enhance or improve process stability, maintain and control a desired temperature profile.

In a specific embodiment, the apparatus includes a capsule region (for example, having a cylindrical shape) comprising a first region and a second region, and a length defined between the first region and the second region. In a specific embodiment, a capsule is disposed within the capsule region. As an example, the capsule is made of a suitable material that is chemically inert, can withstand pressure, and may also be easy to handle, among other features. Depending upon the embodiment, the capsule is made of a material selected from gold, platinum, silver, palladium, or a combination of any of the foregoing. Of course, there can also be other suitable materials, which can also include alloys, coatings, and/or multi-layered structures, depending upon the specific embodiment. Other metals can include titanium, rhenium, copper, stainless steel, zirconium, tantalum, alloys thereof, and the like. In a specific embodiment, the capsule is characterized by a deformable material and is substantially chemically inert relative to one or more reactants within the capsule region. An example of a capsule is described in U.S. Pat. No. 7,125,453, which is incorporated by reference herein in its entirety.

In a specific embodiment, the apparatus has an annular heating member enclosing the capsule region. Another example of a heating member is described in U.S. Publication No. 2008/0083741A1, which is also incorporated by reference herein. The heating member may have at least two independently controllable hot zones and may be capable of generating heating power as large as 3 kilowatts, 10 kilowatts, 30 kilowatts, 100 kilowatts, 300 kilowatts, or 1000 kilowatts.

In a specific embodiment, the apparatus has at least one continuous annular ceramic or metal or cermet member having a predetermined thickness disposed continuously around a perimeter of the annular heating member. In a specific embodiment, the continuous annular member is made of a material having a compressive strength of about 0.5 GPa and greater and a thermal conductivity of about 4 watts per meter-Kelvin and less. As an example, the ceramic material can comprise rare earth metal oxide, zirconium oxide, hafnium oxide, magnesium oxide, calcium oxide, aluminum oxide, yttrium oxide, sialon (Si—Al—O—N), silicon nitride, silicon oxynitride, garnets, cristobalite, or mullite. The ceramic material may be a composite, comprising more than one phase. Alternatively, as an example, the metal can be a refractory metal such as tungsten, molybdenum, TZM alloy, and others. The cermet can be cobalt-cemented tungsten carbide, and others. In an alternative embodiment, which will be described further below, the continuous annular ceramic, metal, or cermet member is configured to include a plurality of crack regions disposed in a non-symmetrical manner and disposed between an inner diameter of the continuous annular ceramic, metal, or cermet member and an outer diameter of the continuous annular ceramic, metal, or cermet member. In a specific embodiment, the annular member is one of a plurality of members, which are stacked on top of each other.

In a specific embodiment, the apparatus also has a cylindrical sleeve member disposed overlying the at least annular ceramic, metal or cermet member. As an example, the cylindrical sleeve member is made of a material selected from stainless steel, iron, steel, iron alloy, nickel or nickel alloy, cobalt or cobalt alloy, and any combinations thereof. In a specific embodiment, the cylindrical sleeve member comprises a first end and a second end. In a specific embodiment, the cylindrical sleeve has determined dimensions.

Depending upon the embodiment, the first end is characterized by a first outer diameter and the second end is characterized by a second outer diameter, which is less than the first outer diameter, to form a taper angle between an axis of the cylindrical sleeve member and an outer region of the cylindrical sleeve member, the taper angle ranging from about 0.1 degrees to about 5 degrees.

Additionally, the cylindrical sleeve member may comprises a substantially constant inner diameter from the first end to the second end according to a specific embodiment, although the inner diameter can also vary depending upon the embodiment. In a certain embodiment, the cylindrical sleeve member is configured to compress the continuous annular ceramic member in cooperation with the high pressure enclosure material. In a certain embodiment, the cylindrical sleeve member is configured to provide mechanical support to maintain a determined shape of the continuous annular ceramic member. In a more certain embodiment, the cylindrical sleeve is configured to compress the continuous annular ceramic member in cooperation with the high pressure enclosure material and is configured to provide mechanical support to maintain a determined shape of the continuous annular ceramic member. In a certain embodiment, the outer diameter of the cylindrical sleeve is tapered from one end to an opposite end with a taper angle between about 0.1 degrees and about 5 degrees.

In a specific embodiment, the apparatus has a high strength enclosure material disposed overlying the annular ceramic member. In a specific embodiment, the high strength enclosure is made of a suitable material to house internal contents including capsule, heater, sleeve, among other elements. In a specific embodiment, the high strength enclosure is made of a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel®, Inconel®, Hastelloy®, Udimet® 500, Stellite®, René™ 41, and René™88. In a certain embodiment, the high strength enclosure comprises a material with ultimate tensile strength and yield strength characteristics so as to be rated by the American Society of Mechanical Engineers for continuous operation as a pressure vessel at a pressure higher than 50,000 pounds per square inch.

The high strength enclosure also has a desired length and width according to a specific embodiment. In a specific embodiment, the high strength enclosure has a length and an inner diameter to define an aspect ratio between about 2 to about 25. The high strength enclosure has a length and an inner diameter to define an aspect ratio of about ten to about twelve. In a specific embodiment, the inner diameter is between about two inches and about fifty inches. In a specific embodiment, the height of the high strength enclosure is between 6 inches and 500 inches. The ratio between the outer diameter and the inner diameter of the high strength enclosure may be between 1.2 and 5. In a specific embodiment, the diameter ratio may be between about 1.5 and about 3.

External cooling may be provided for at least the outer diameter of the high strength enclosure. In certain embodiments, cooling jackets enclose the high strength enclosure and a coolant, for example, water or a water-anti-freeze solution, passed through the jackets. In certain embodiments, channels are provided in the outer diameter of the high strength enclosure. In certain embodiments, coolant is flowed directly through the channels. In certain embodiments, square, rectangular, or round tubing is placed within the channels and coolant is flowed through the tubing. In certain embodiments, the temperature of the outer diameter of the high strength enclosure is monitored by at least one thermocouple.

Figure 3:
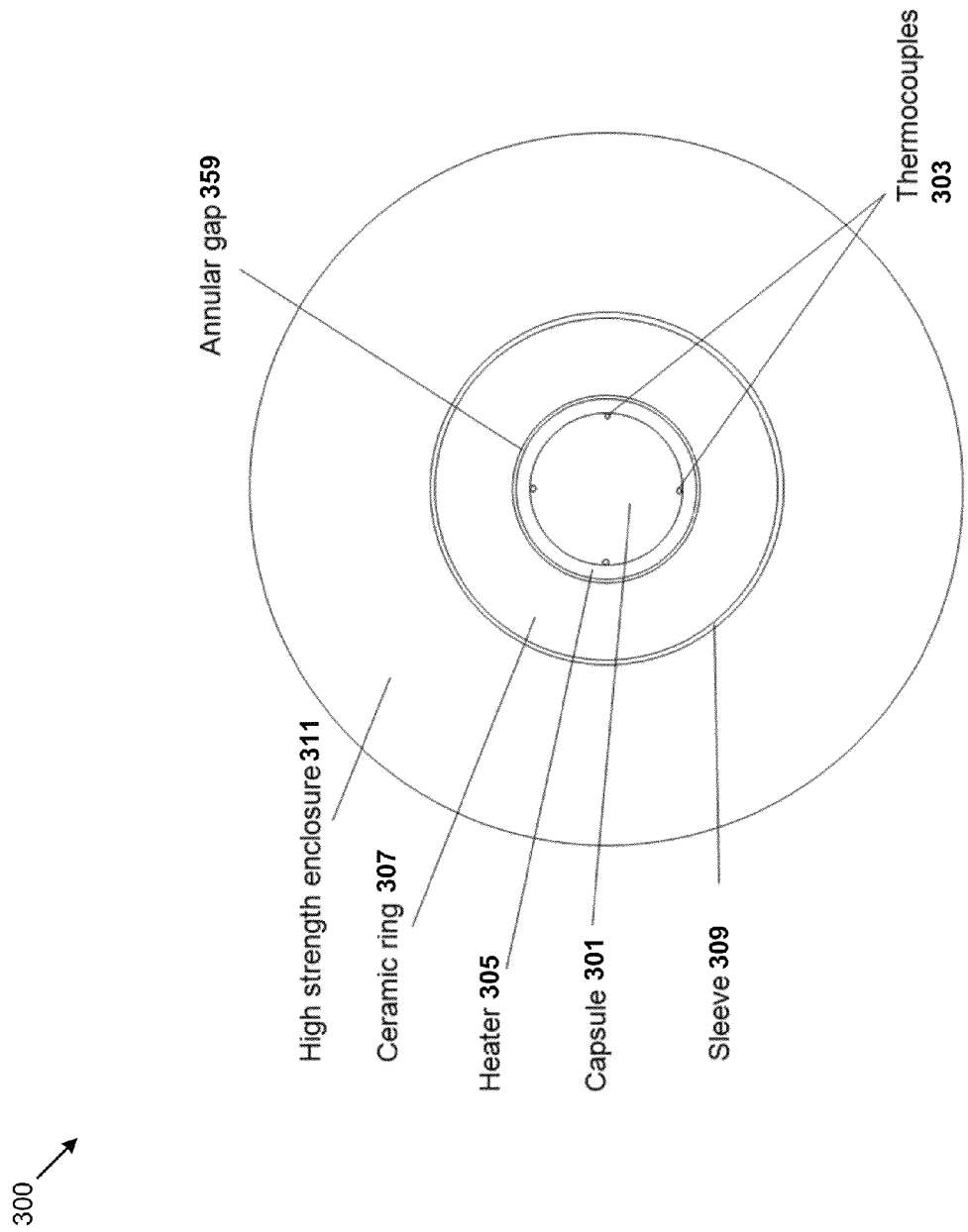
FIG. 3 is a simplified diagram of a cross-sectional view of a high pressure apparatus according to an embodiment of the present disclosure.

In a specific embodiment, the present apparatus 300 is illustrated by way of FIG. 3. This diagram is merely an example, which should not unduly limit the scope of the claims herein. One of ordinary skill in the art would recognize other variations, modifications, and alternatives. Instead of individual radial segments disposed one after another within the apparatus, one or more rings 307 or annular ceramic members may be stacked within the apparatus. The ring may comprise a ceramic, such as alumina, silicon nitride, silicon carbide, zirconia, or the like, including other materials described herein as well as outside of the specification, which are known to one of ordinary skill in the art. The ring may alternatively comprise a refractory metal, such as tungsten, molybdenum, or TZM alloy, or a cermet, such as Co-cemented tungsten carbide. The ring may have an inner diameter between 0.5 inch and 24 inches, an outer diameter between 1 inch and 48 inches, and a height between 1 inch and 96 inches. In a specific embodiment, the inner diameter is between about 1.5 inches and about 8 inches and the height is between 1.5 inches and 8 inches. The ratio between the outer diameter and the inner diameter of the rings may be between 1.05 and 60. In a specific embodiment, the diameter ratio may be between about 1.5 and about 3. The ring may have a density greater than 95% of theoretical density. The modulus of rupture of the ring material may be greater than 200 or 450 MPa. The fracture toughness of the ring material may be greater than 9 MPa-m$^{1/2}$. Depending on the dimensions of the rings and of the high strength enclosure, one to 200 rings may be stacked on top of one another inside the high strength enclosure.

In a specific embodiment, a spacer, with a thickness between 0.001 inch and 0.1 inch, may be placed between successive rings in the stack to allow for thermal expansion. As shown in FIG. 3, a sleeve 309 may be placed around each ring 307. The sleeve 309 may comprise steel or other suitable material according to a specific embodiment. The sleeve 309 may be between 0.020 inch and 0.5 inch thick, and their height may be between 0.25 inch less than that of the ring and 0.1 inch greater than that of the ring depending upon the embodiment. The apparatus also includes a capsule 301, thermocouples 303, which are coupled electrically to temperature controller and/or power controller, a heater 305, and a high strength enclosure 311, among other elements.

In a specific embodiment the ceramic rings do not crack significantly under operating conditions, as represented in FIG. 3. The fracture strength of the rings may be higher than the operating pressure of the capsule, for example. In another embodiment, radial compressive loading of the rings is provided by an interference fit with the high strength enclosure. In an embodiment, an interference fit is achieved by at least one of heating of the high strength enclosure and cooling of the ring prior to assembly. In another embodiment, an interference fit is achieved by grinding a slight taper, for example, approximately one degree, on the inner diameter of the high strength enclosure and on the ring and/or the sleeve surrounding the ring, and then pressing the ring and sleeve into the high strength enclosure to achieve the interference fit.

Figure 4A:
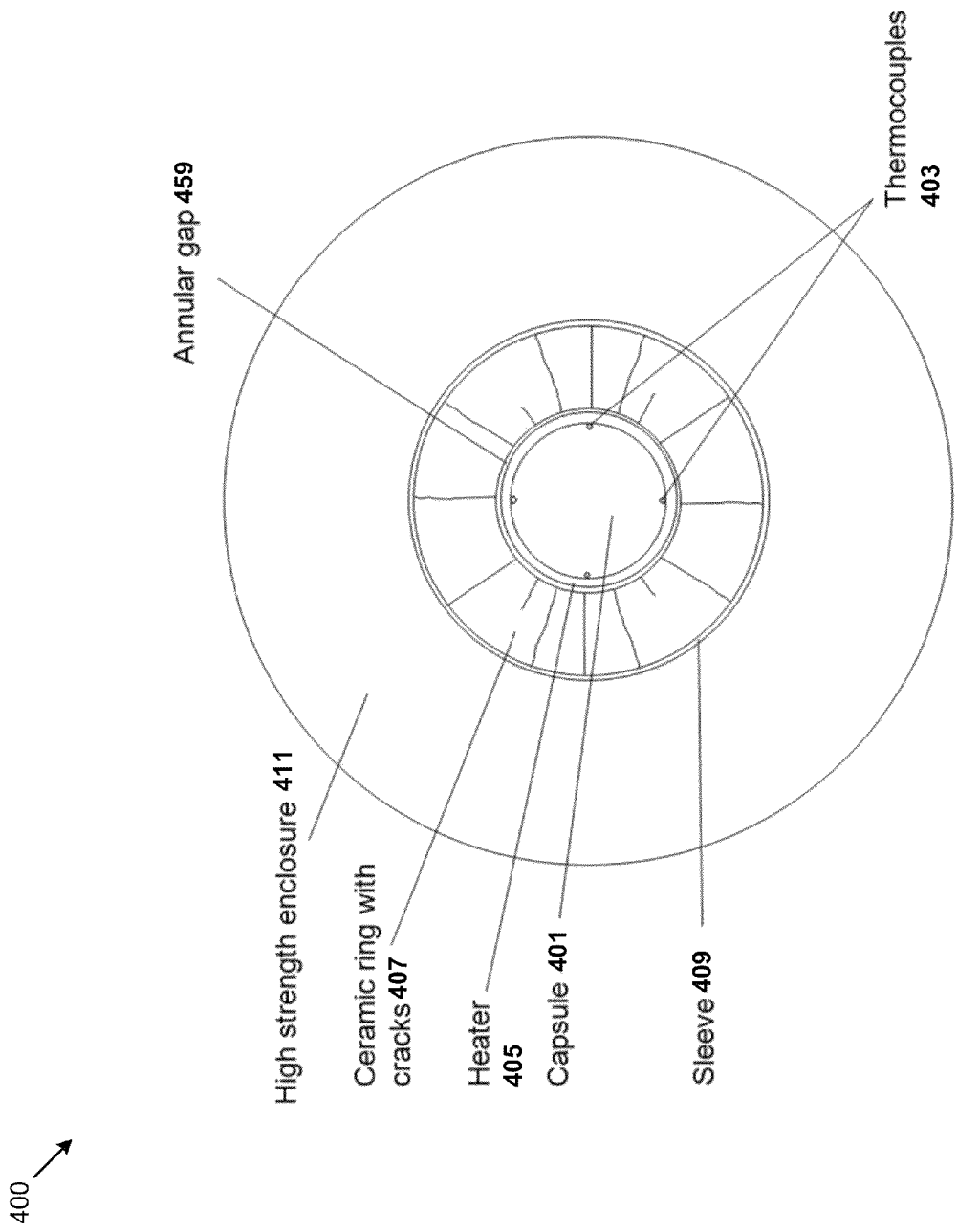
FIG. 4A is a simplified diagram of a cross-sectional view of a high pressure apparatus according to an embodiment of the present disclosure.

In another embodiment, the rings have at least one crack under operating conditions in the apparatus 400, as shown in FIG. 4A. In a specific embodiment, the rings 407 are inserted into the high strength enclosure and allowed to crack during initial operation. Cracking in particular positions may be facilitated by scribing the inner diameter of the ring at the points of the desired crack initiation. The resulting cracks may run all the way from the inner diameter to the outer diameter, or they may terminate within the volume of the ring and/or have any combinations of these structures. In another embodiment, the rings are cracked prior to insertion into the high strength enclosure. Pre-cracking may be achieved by sliding a precision-turned rod having a larger coefficient of thermal expansion than the ring into the inner diameter of the ring and heating. The sleeve 409 surrounding the ring will keep and maintain all parts of the ring together and precisely oriented with respect to each other in the event that cracks run completely through the ring at various radial positions. In another embodiment, cracks are present within the volume of the ring and contact neither the inner diameter nor the outer diameter of the ring. The apparatus 400 also includes a capsule 401, thermocouples 403, which are coupled electrically to temperature controller and/or power controller, a heater 405, and a high strength enclosure 411, among other elements.

Figure 4B:
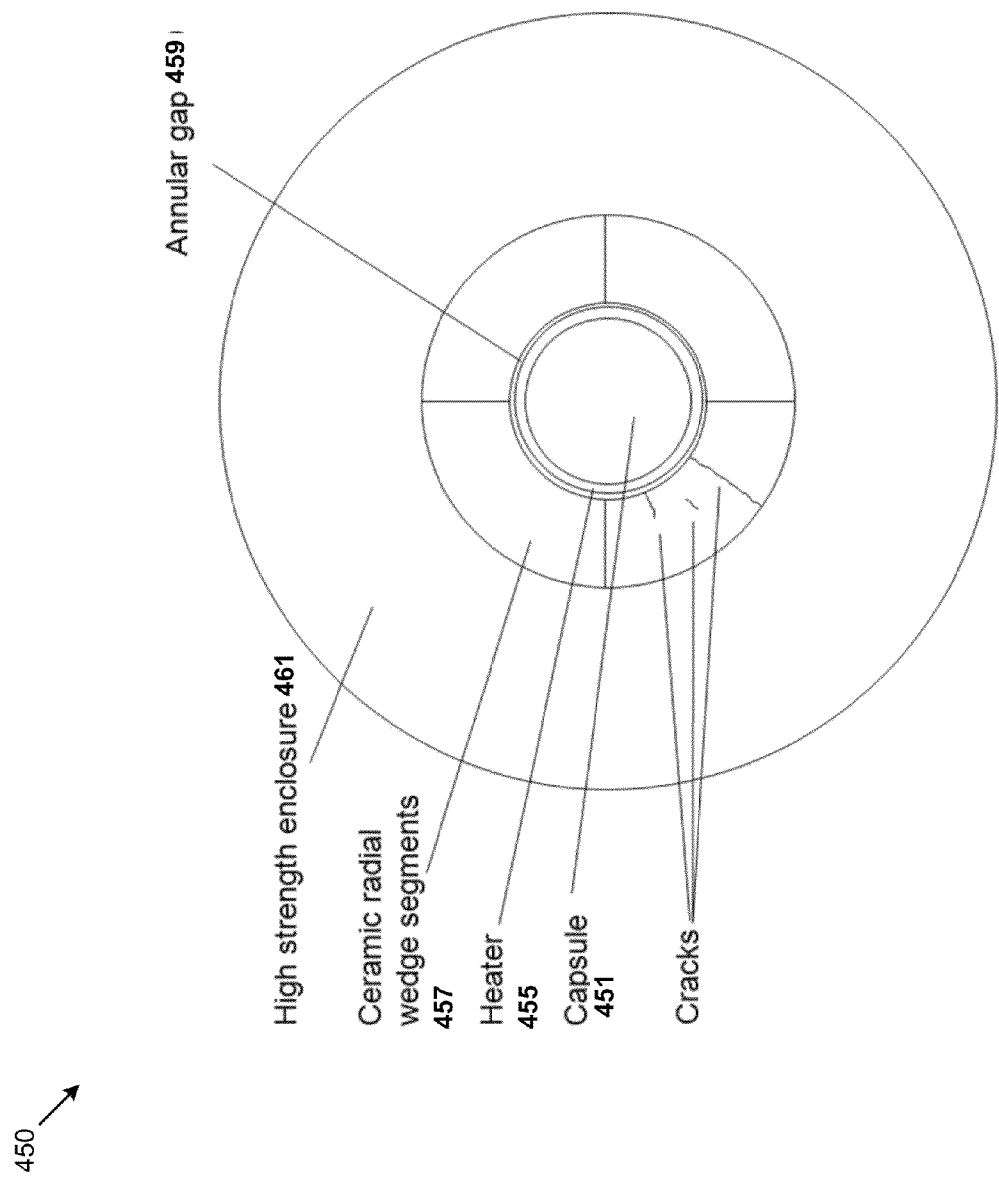
FIG. 4B is a simplified cross-sectional view of an alternative high pressure apparatus according to an alternative embodiment of the present disclosure.

FIG. 4B is a simplified cross-sectional view diagram of an alternative high pressure apparatus according to an alternative embodiment of the present disclosure. In certain embodiments, at least two annular ceramic radial segments 457 are arranged sequentially and disposed continuously around a perimeter of an annular heating member 455. In a specific embodiment, the two or more annular segments or annular radial ceramic segments 457, which form a continuous ring structure, are inserted into the high strength enclosure and allowed to crack during initial operation. In a specific embodiment, there are two or more annular segments or three or more annular segments or four or more annular segments or other combinations, where each of the segments may have a similar length or different lengths. Cracking in particular positions may be facilitated by scribing the inner diameter of the two or more annular segments at the points of the desired crack initiation. The resulting cracks may run all the way from the inner diameter to the outer diameter, or they may terminate within the volume of the two or more annular segments and/or have any combinations of these structures.

In another embodiment, the two or more annular segments are cracked prior to insertion into the high strength enclosure.

Pre-cracking may be achieved by sliding a precision-turned rod having a larger coefficient of thermal expansion than the two or more annular segments into the inner diameter of the segmented rings and heating them. The sleeve 409 surrounding the segments will keep and maintain all parts of the segments together and precisely oriented with respect to each other, including the case where cracks run completely through the segments at various radial positions. In another embodiment, cracks are present within the volume of the segments and contact neither the inner diameter nor the outer diameter of the segments. The apparatus 450 also includes a capsule 451, thermocouples, which are coupled electrically to temperature controller and/or power controller, an annular heating member 455, a high strength enclosure 461, among other elements. In one embodiment, an annular heating member surrounds at least a portion of the length of the capsule opening. In certain embodiments, an annular heating member surrounds the entire length of the capsule opening.

In a specific embodiment, the present method and related annular ceramic radial segments include slight irregularities and/or imperfections. In a specific embodiment, the segments are made of a suitable material that can accommodate itself by cracking. Additionally, slight changes in dimensions of each of the ceramic members are also accommodated by the cracks, which allow the assembly to be disposed around the heating member in a substantially continuous manner. In a specific embodiment, the present apparatus and related device prevents any rupture of a capsule and/or high strength enclosure by providing a buffer and/or insulating region between the capsule and high strength enclosure.

FIGS. 3, 4, and 4A show cross-sectional views of the apparatus shown in FIG. 2. The top and bottom of the cavity defined by the inner diameter of the rings is terminated by insulating plugs positioned proximate to end flanges, as shown in FIG. 2. The end flanges may be attached to the high strength enclosure by means of bolts. The length-to-diameter ratio of the cavity should be at least 2:1 and more preferably lies in the range between 5:1 and 15:1.

In order to measure the temperature at various heights on the outer diameter of the capsule, prior to assembly at least one axial dent or groove is placed on the outer diameter of the capsule at specified radial positions. In the examples shown in FIGS. 3 and 4, four dents or grooves are placed 90 degrees apart along the outer diameter of the capsule. The groove or dent may extend the entire height of the capsule or may terminate at the height along the capsule where a temperature measurement is desired. The width and depth of the groove or dent may be between about 0.025 inch and 0.130 inch. Holes that are slightly larger in diameter than the thermocouple may be placed in one or in both end flanges. Holes or grooves may also be placed in at least one insulating cylinder separating the end flange from the capsule. Thermocouples may be inserted into the grooves or dents after insertion of the capsule into the heater, followed by placement of the end flanges onto the high strength enclosure. Alternatively, one or more thermocouples may be inserted into the grooves or dents prior to placement of the end flanges, and the free ends strung through the end flanges prior to placement of the latter and attachment of the electrical connections to the free ends of the thermocouples.

The pressure inside the capsule during processing may be monitored indirectly by mounting one or more strain gauges on the periphery of the high strength enclosure. The strain gauges may be temperature-compensated.

Annular gaps between members may be present during assembly. For example, referring again to FIG. 3, an annular gap 359 (not shown to scale) may be present between the outer diameter of heater or heating member 305 and the inner diameter of a load-bearing radial heater restraint comprising annular ceramic ring 307 and high strength enclosure 311. Referring again to FIG. 4A, an annular gap 459 (not shown to scale) may be present between the outer diameter of heater or heating member 405 and the inner diameter of a radial heater restraint comprising annular ceramic ring with cracks 407 and high strength enclosure 411. Referring again to FIG. 4B, an annular gap 459 (not shown to scale) may be present between the outer diameter of the annular heating member 455 and the inner diameter of a load-bearing radial heater restraint comprising ceramic radial wedge segments 457 and high strength enclosure 461. As used herein, the term radial heater restraint may refer to annular ceramic radial wedge segments 457, or may refer to a non-segmented annular ceramic member, such as illustrated schematically in FIGS. 3 and 4A. However, other forms of radial heater restraint are also contemplated. Again referring to annular gaps between members that may be present during assembly, in certain embodiments gaps have particular dimensions. For example, an annular gap can be intentionally designed to have certain absolute dimensions (such as a diametric gap expressed as a linear distance). Or, for example, an annular gap can be intentionally expressed so as to achieve an annular gap having certain relative dimensions (such as a first diameter expressed as a percentage difference to a second diameter).

During operation of the apparatus, electrical energy is provided to the heater, warming the heater, the capsule, and the solvent within the capsule. The solvent may begin to generate pressure within the capsule. Both the thermal expansion coefficient of the capsule and internal pressure within the capsule due to the solvent will provide a driving force for radial expansion of the capsule, although the actual radial expansion of the capsule may be limited by contact and restraining force provided by the heater. It should be noted that the term "contact", as used herein, generally refers to a non-zero contact pressure over a substantial surface area of one of the contacting bodies. Both the thermal expansion coefficient of the heater and internal force due to the capsule will provide a driving force for radial expansion of the heater, although the actual radial expansion of the heater may be limited by contact and restraining force provided by the at least one annular ceramic member or of the at least two annular ceramic radial segments, which in turn are constrained by the high strength enclosure. The inner diameter of the at least one annular ceramic member or of the at least two annular ceramic radial segments will be heated by the heater, while the outer diameter of the at least one annular ceramic member or of the at least two annular ceramic radial segments may be cooled by thermal conduction to the high strength enclosure, whose outer diameter may be actively cooled. Radial and hoop stresses in the high strength enclosure may be generated by: (i) an interference fit between the at least one annular ceramic member and the high strength enclosure; (ii) a temperature gradient within the at least one annular ceramic member or of the at least two annular ceramic radial segments; (iii) restraint of the thermal expansion of the heater; (iv) restraint of the thermal expansion of the capsule; and (v) the pressure within the capsule. The magnitude of the radial and hoop stresses in the high strength enclosure will be impacted by the magnitude of the annular gaps between the capsule and the heater and between the heater and the at least one annular ceramic member or of the at least two annular ceramic radial segments.

In certain embodiments, annular gaps are provided that are sufficient for assembly but no larger, so as to ensure relatively tight fits. In certain embodiments the annular gaps may be between about 0.001 inch and about 0.010 inch. In operation, the combination of thermal expansion of the capsule and of pressure within the capsule due to the solvent may cause the outer diameter of the capsule to contact the inner diameter of the heater and begin generating stress within the heater at temperatures above about 30 degrees Celsius but below about 100 degrees Celsius. The combination of thermal expansion of the heater and of internal loading by the capsule may cause the outer diameter of the heater to contact the inner diameter of the at least one annular ceramic member or of the at least two annular ceramic radial segments and begin contributing to stress within the high strength enclosure at temperatures above about 30 degrees Celsius but below about 150 degrees Celsius. As earlier mentioned, an annular gap can be intentionally formed, and can be expressed so as to achieve an annular gap having certain relative dimensions (such as a first radius expressed as a percentage difference to a second radius).

In certain embodiments, the annular gaps are designed to be larger than are required for assembly in order to reduce the magnitude of stresses within the heater restraint or high strength enclosure. For example, the diametric annular gap between the outer diameter of the capsule and the inner diameter of the heater may be greater than about 0.005 inch, greater than about 0.010 inch, greater than about 0.020 inch, greater than about 0.030 inch, or greater than about 0.050 inch. The diametric annular gap between the outer diameter of the heater and the inner diameter of the radial heater restraint may be greater than about 0.005 inch, greater than about 0.010 inch, greater than about 0.015 inch, greater than about 0.020 inch, greater than about 0.030 inch, or greater than about 0.050 inch. In certain embodiments, the diametric annular gap between the outer diameter of the heater and the inner diameter of the radial heater restraint, expressed as a percentage of the inner diameter of the radial heater restraint, may be greater than 0.1%, greater than 0.3%, greater than 0.5%, greater than 0.7%, greater than 0.9%, or greater than 1.1%. In operation, the combination of thermal expansion of the capsule and of pressure within the capsule due to the solvent may cause the outer diameter of the capsule to contact the inner diameter of the heater and begin generating stress within the heater at temperatures not less than about 50 degrees Celsius or not less than about 100 degrees Celsius. During this initial period of heating the internal pressure within the capsule is supported by the capsule itself, whose outermost member may comprise steel or a nickel-based superalloy. The combination of thermal expansion of the heater and of internal loading by the capsule may cause the outer diameter of the heater to contact the inner diameter of the at least one annular ceramic member or of the at least two annular ceramic radial segments and begin contributing to stress within the high strength enclosure at temperatures not less than about 50 degrees Celsius, not less than about 100 degrees Celsius, not less than about 150 degrees Celsius, not less than about 200 degrees Celsius, not less than about 250 degrees Celsius, not less than about 300 degrees Celsius, not less than about 350 degrees Celsius, not less than about 400 degrees Celsius, not less than about 450 degrees Celsius, or not less than about 500 degrees Celsius. During this initial period of heating the internal radial loading within the heater is supported by the heater itself. The heater may comprise an iron-based superalloy, a cobalt-based superalloy, or a nickel-based superalloy such as Inconel® 718, Hastalloy® X, Udimet® 500, Stellite®, René™ 41, René™ 88, or Mar-M247. The temperature at which contact between the heater and the radial heater restraint occurs may be identified from an inflection point in the microstrain of the outer diameter of the high strength enclosure versus temperature: the rate of increase in microstrain is greater at temperatures above the contact temperature than it is at temperatures below the contact temperature.

A method according to a specific embodiment is briefly outlined below.

1. Provide an apparatus for high pressure crystal growth or material processing, such as the one described above, but can be others, the apparatus comprising a capsule region (for example, cylindrical in shape) comprising a first region and a second region, and a length defined between the first region and the second region, an annular heating member enclosing the capsule region, at least one continuous ceramic or annular metal or cermet member having a predetermined thickness disposed continuously around a perimeter of the annular heating member and an high strength enclosure material disposed overlying the annular ceramic member;

2. Provide capsule containing a solvent;

3. Place the capsule within an interior region of the capsule region;

4. Process the capsule with thermal energy to cause an increase in temperature within the capsule to greater than 200 Degrees Celsius to cause the solvent to be superheated;

5. Form a crystalline material from a process of the superheated solvent;

6. Remove thermal energy from the capsule to cause a temperature of the capsule to change from a first temperature to a second temperature, which is lower than the first temperature;

7. Remove a first flange and a second flange from the high pressure apparatus;

8. Move a mechanical member, using a hydraulic drive force, from the first region of the capsule region toward the second region to transfer the capsule out of the capsule region;

9. Open the capsule;

10. Remove the crystalline material; and

11. Perform other steps, as desired.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein. Details of the present method and structure can be found throughout the present specification and more particularly below.

Figure 5:
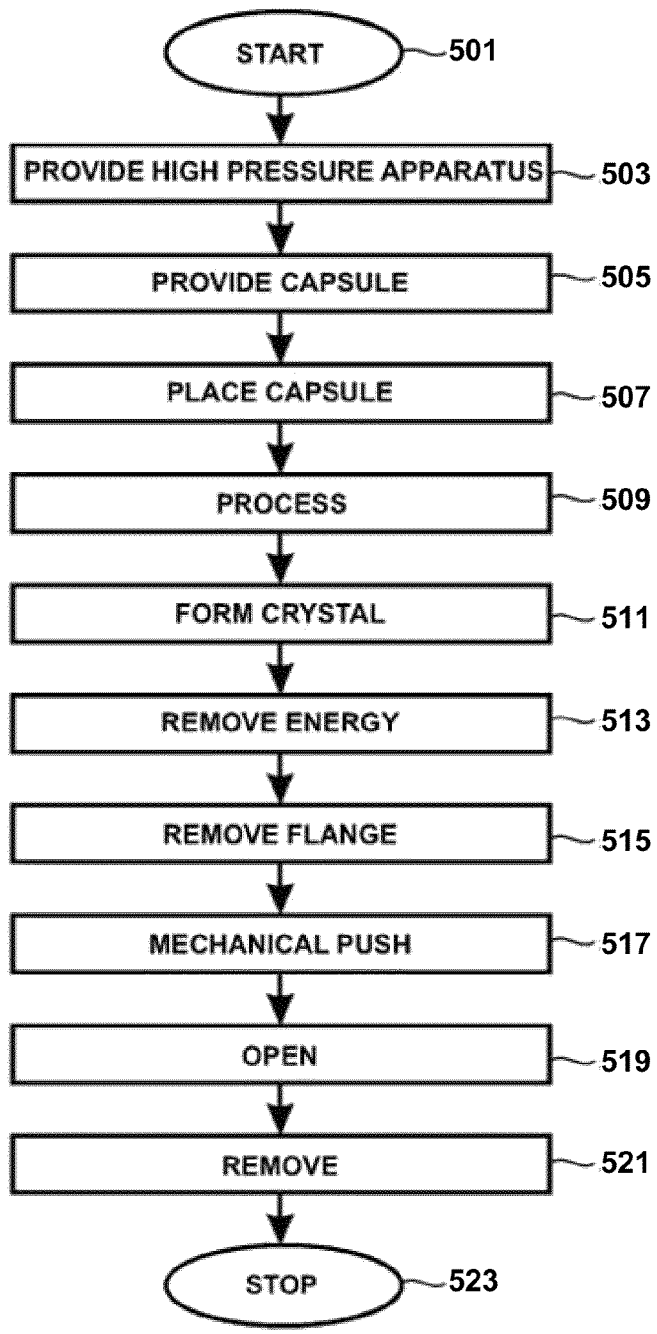
FIG. 5 is a simplified flow diagram of a method of processing a material within a supercritical fluid according to an embodiment of the present disclosure.

FIG. 5 is a simplified diagram 500 of a method of processing a supercritical fluid according to an embodiment of the present disclosure. This diagram is merely an example, which should not unduly limit the scope of the claims herein. One of ordinary skill in the art would recognize other variations, modifications, and alternatives. In a specific embodiment, the method beings with start, step 501. The method begins by providing (step 503) an apparatus for high pressure crystal or material processing, such as the one described above, but can be others. In a specific embodiment, the apparatus has a capsule region comprising a first region and a second region, and a length defined between the first region and the second region. The apparatus also has an annular heating member enclosing the capsule region, at least one continuous ceramic or annular metal or cermet member having a predetermined thickness disposed continuously around a perimeter of the annular heating member and a high strength enclosure material disposed overlying the annular ceramic member.

In a specific embodiment, the method provides (step 505) a capsule containing a solvent, such as ammonia, for example. In a specific embodiment, the method places (step 507) the capsule containing the solvent and starting crystal within an interior region of the capsule region. The method processes (step 509) the capsule with thermal energy to cause an increase in temperature within the capsule to greater than 200 Degrees Celsius to cause the solvent to be superheated.

Referring again to FIG. 5, the method forms (step 511) a crystalline material from a process of the superheated solvent. In a certain embodiment, the crystalline material is gallium containing crystal such as GaN, AlGaN, InGaN, and others. In a specific embodiment, the method removes (step 513) thermal energy from the capsule to cause a temperature of the capsule to change from a first temperature to a second temperature, which is lower than the first temperature. Once the energy has been removed and temperature reduced to a suitable level, the method removes one or more flanges (step 515), which mechanically held at least the capsule in place. In a certain embodiment, the method uses a mechanical member, such as a plunger, to hydraulically move (step 517) the mechanical member from the first region of the capsule region toward the second region to transfer the capsule out of the capsule region free from the apparatus.

In a specific embodiment, the capsule is now free from the apparatus. In a specific embodiment, the capsule is opened, step 519. In a certain embodiment, the crystalline material is removed from an interior region of the capsule, step 521. Depending upon the embodiment, there can also be other steps, which can be inserted or added or certain steps can also be removed. In a specific embodiment, the method ends at stop, step 523.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

A method according to an alternative specific embodiment is briefly outlined below.

1. Assemble an apparatus for high pressure crystal or material processing, such as the one described above, but can be others, the apparatus comprising a capsule region comprising a first region and a second region, and a length defined between the first region and the second region, an annular heating member enclosing the capsule region, at least one continuous ceramic or annular metal or cermet member having a predetermined thickness disposed continuously around a perimeter of the annular heating member and an high strength enclosure material disposed overlying the annular ceramic member;
2. Provide material to be processed and solvent in a capsule;
3. Place the capsule within an interior region of the capsule region;
4. Place annular plugs, end caps, end flanges onto ends of the apparatus;
5. Attach end flanges using at least one fastener;
6. Provide electrical energy to heating member to cause an increase in temperature within the capsule to greater than 200 Degrees Celsius to cause the solvent to be superheated;
7. Form a crystalline material from a process of the superheated solvent;
8. Remove thermal energy from the capsule to cause a temperature of the capsule to change from a first temperature to a second temperature, which is lower than the first temperature;
9. Remove a first flange and a second flange from the high pressure apparatus;
10. Move a mechanical member, using a hydraulic drive force, from the first region of the capsule region toward the second region to transfer the capsule out of the capsule region;
11. Open the capsule;
12. Remove the crystalline material; and
13. Perform other steps, as desired.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein. Details of the present method and structure can be found throughout the present specification and more particularly below.

Figure 6:
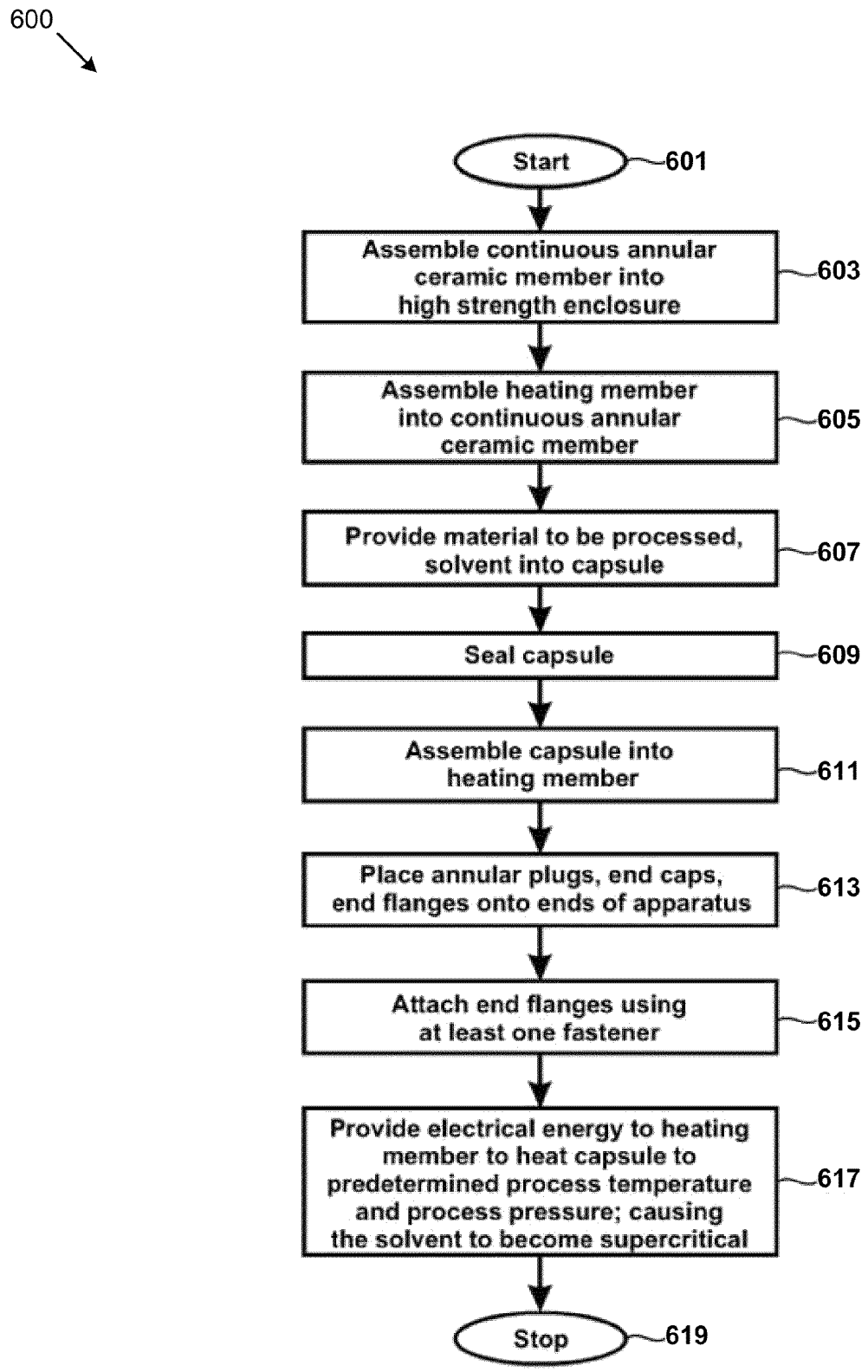
FIG. 6 is a simplified flow diagram of an alternative method of processing a material within a supercritical fluid according to an alternative embodiment of the present disclosure.

FIG. 6 is a simplified flow diagram 600 of an alternative method of processing a material within a supercritical fluid according to an alternative embodiment of the present disclosure. This diagram is merely an example, which should not unduly limit the scope of the claims herein. One of ordinary skill in the art would recognize other variations, modifications, and alternatives. In a specific embodiment, the method beings with start, step 601. The method begins by assembling (step 603) an apparatus for high pressure crystal or material processing, such as the one described above, but can be others. In a specific embodiment, the apparatus has a capsule region (for example, cylindrical in shape) comprising a first region and a second region, and a length defined between the first region and the second region. The apparatus also has an annular heating member enclosing the capsule region and at least one continuous ceramic or annular metal or cermet member having a predetermined thickness disposed continuously around a perimeter of the annular heating member, which are assembled together, step 605. In a specific embodiment, the capsule, heating member, and annular member are inserted into a high strength enclosure material disposed overlying the annular ceramic member.

In a specific embodiment, the method provides a capsule containing a solvent, such as ammonia, for example, which includes a material to be processed, step 607. In a certain embodiment, the capsule is sealed, step 609. In a specific embodiment, each of the capsule ends are welded and/or brazed to form a sealed capsule structure. In a specific embodiment, the method assembles by placing (step 611) the capsule containing the solvent and starting crystal within an interior region of the capsule region. In a certain embodiment, the method places annular plugs, end caps, and end flanges on to each of the ends of the apparatus, step 613, and attaches end flanges using a fastener 615. See, for example, FIG. 2. In a certain embodiment, each of the end flanges is secured by way of a fastener or a plurality of fasteners.

In a specific embodiment, the method provides electrical energy (step 617) in the form of power to the heating member. The heating member provides thermal energy to the capsule to a predetermined process temperature and pressure, which cause the solvent to be in a supercritical state according to a specific embodiment. The method processes the capsule with thermal energy to cause an increase in temperature within the capsule to greater than 200 Degrees Celsius to cause the solvent to be superheated.

In a specific embodiment, the method forms a crystalline material from a process of the superheated solvent. In a certain embodiment, the crystalline material is gallium containing nitride crystal such as GaN, AlGaN, InGaN, and others. In a specific embodiment, the method removes thermal energy from the capsule to cause a temperature of the capsule to change from a first temperature to a second temperature, which is lower than the first temperature. Once the energy has been removed and temperature reduced to a suitable level, the method removes one or more flanges, which mechanically held at least the capsule in place. In a certain embodiment, the method uses a mechanical member, such as a plunger, to hydraulically move the mechanical member from the first region of the capsule region toward the second region to transfer the capsule out of the capsule region free from the apparatus.

In a specific embodiment, the capsule is now free from the apparatus. In a specific embodiment, the capsule is opened. In a certain embodiment, the crystalline material is removed from an interior region of the capsule. Depending upon the embodiment, there can also be other steps, which can be inserted or added or certain steps can also be removed. In a specific embodiment, the method ends at stop, step 619.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

In certain embodiments, a gallium-containing nitride crystal or boule grown by methods such as those described above is sliced or sectioned to form wafers. The slicing, sectioning, or sawing may be performed by methods that are known in the art, such as internal diameter sawing, outer diameter sawing, fixed abrasive multiwire sawing, fixed abrasive multiblade sawing, multiblade slurry sawing, multiwire slurry sawing, ion implantation and layer separation, or the like. The wafers may be lapped, polished, and chemical-mechanically polished according to methods that are known in the art.

One or more active layers may be deposited on the well-crystallized gallium-containing nitride wafer. The active layer may be incorporated into an optoelectronic or electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

Figure 7:
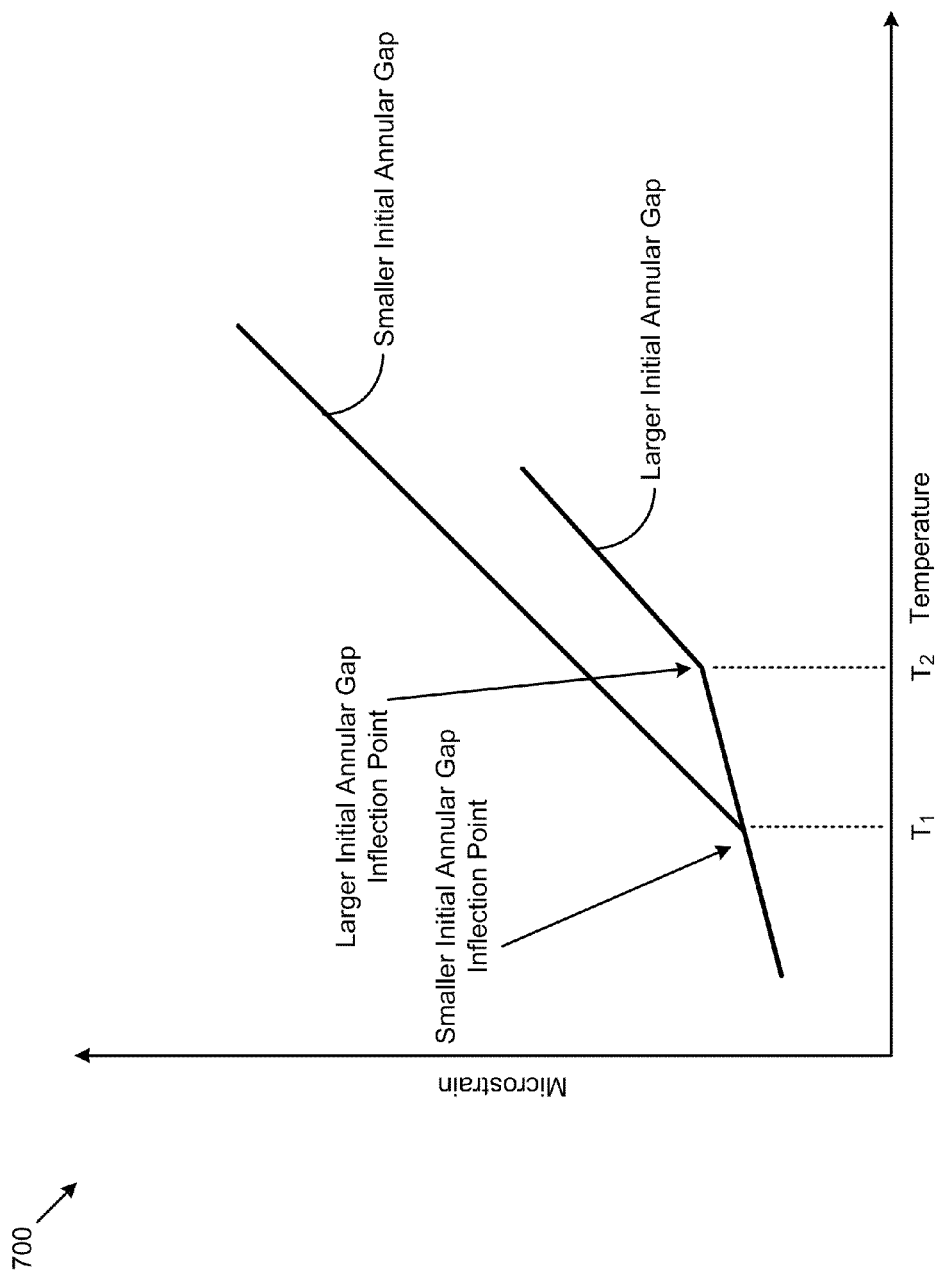
FIG. 7 is a graph showing lower microstrain at the outer diameter of a high strength enclosure for a configuration with a larger annular gap, as compared with microstrain for a configuration with a smaller annular gap, according to some embodiments.

FIG. 7 is a graph showing the microstrain that may be measured on an outer diameter of the high strength enclosure as a function of the temperature of the heater for two configurations: a first configuration having a smaller initial annular gap, and a second configuration having a larger initial annular gap. In the first configuration, as the heater is initially heated, strain builds in the high strength enclosure at a low rate. Then, at temperature $T_1$, the heater makes a load-bearing contact with the radial heater restraint and, as the temperature is increased further, microstrain builds up in the high strength enclosure at a higher rate. In the second configuration, as the heater is initially heated, strain builds up in the high strength enclosure at the same low rate as in the first configuration. However, at temperature T1 the heater has still not established a load-bearing contact with the radial heater restraint because of the larger annular gap. However, at temperature T2 the heater makes a load-bearing contact with the radial heater restraint and, as the temperature is increased further, strain builds up in the high strength enclosure at a higher rate. However, since strain buildup in the high strength enclosure at the higher rate is delayed in the second configuration compared to the first configuration, owing to the larger initial annular gap, the absolute magnitude of the microstrain at a given temperature, above $T_1$ and $T_2$, such as the operating temperature during a crystal growth process, is less in the second configuration than it is in the first configuration. The lower magnitude of microstrain in the high strength enclosure implies a higher engineering safety factor, higher reliability, and greater lifetime. Over the full range shown, incorporation of a larger annular gap leads to a higher load-bearing contact temperature and to a reduced microstrain at an operating temperature above the radial load-bearing contact temperature. Thus, a particular annular gap can be selected in order to achieve a first radial load-bearing contact at a temperature not less than about 100 degrees Celsius, not less than about 150 degrees Celsius, not less than about 200 degrees Celsius, not less than about 250 degrees Celsius, not less than about 300 degrees Celsius, not less than about 350 degrees Celsius, not less than about 400 degrees Celsius, not less than about 450 degrees Celsius, or not less than about 500 degrees Celsius.

For a given set of design parameters for the high pressure apparatus, including the materials of construction, there is a well-defined relationship between the annular gap, expressed as the ratio of the absolute value of the diametric annular gap with respect to the outer diameter of the heater or the inner diameter of the radial heater restraint, and the radial load-bearing temperature. Neglecting the effect of heater expansion due the internal loading by the capsule and constrained thermal expansion of the radial heater restraint, the temperature of initial contact is given by the reference temperature (for example, room temperature, or the temperature of the coolant providing cooling for the outer diameter of the high strength enclosure) plus the annular gap ratio divided by the thermal expansion coefficient of the heater. An example of this relationship is shown in Table 1 for heaters constructed primarily from Inconel 718 or from René™ 41.

TABLE 1

Temperature of contact as a function of relative annular gap for two heater materials.

| | Temperature of contact (degrees Celsius) | |
|---|---|---|
| Annular gap (%) | Inconel ® 718 | René ™ 41 |
| 0.05% | 53 | 56 |
| 0.10% | 86 | 91 |
| 0.20% | 152 | 163 |
| 0.30% | 219 | 234 |
| 0.40% | 285 | 306 |
| 0.50% | 351 | 377 |
| 0.60% | 417 | 449 |

TABLE 1-continued

Temperature of contact as a function of relative annular gap for two heater materials.

| | Temperature of contact (degrees Celsius) | |
|---|---|---|
| Annular gap (%) | Inconel ® 718 | René ™ 41 |
| 0.70% | 484 | 520 |

Following the technique of FIG. 7, and using a chart or graph or table such as is exemplified in Table 1, an apparatus for high pressure material processing that provides radial load-bearing contact at a particular temperature can be constructed. For example comprising:

(1) a cylindrical capsule,
(2) an annular heating member surrounding at least a portion of the length of the capsule, and
(3) a radial heater restraint surrounding at least a portion of the length of the annular heating member where:
   the radial heater restraint comprises a high strength enclosure, and
   where the diametric annular gap between the outer diameter of the annular heating member and the inner diameter of the radial heater restraint is selected to provide radial load-bearing contact above a particular temperature (e.g., at a temperature not less than about 100 degrees Celsius).

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

A heater, comprising Inconel 718, with an inner diameter of approximately 1.020 inch and an outer diameter of approximately 1.500 inch was placed within an internally heated high pressure apparatus comprising an annular ceramic member with an inner diameter of approximately 1.501 inch, and a temperature-compensated strain gauge on the outer diameter of a high strength enclosure. The annular gap was thus approximately 0.001 inch, that is, just enough for a slip fit, and less than 0.1%. By reference to Table 1, the temperature of contact was less than 100 degrees Celsius. A capsule, 60% of whose internal volume was filled with liquid ammonia, was placed within the heater. The apparatus was closed and heated to a temperature of approximately 700 degrees Celsius, and the temperature and microstrain $\epsilon$ of the outer diameter (OD) of the high strength enclosure were measured and recorded. The apparatus was then cooled to room temperature and the capsule removed. This procedure was repeated for ammonia fill percentages of 70, 80, and 90 (100% represents a density of 0.60 grams per cubic centimeter).

Figure 8:
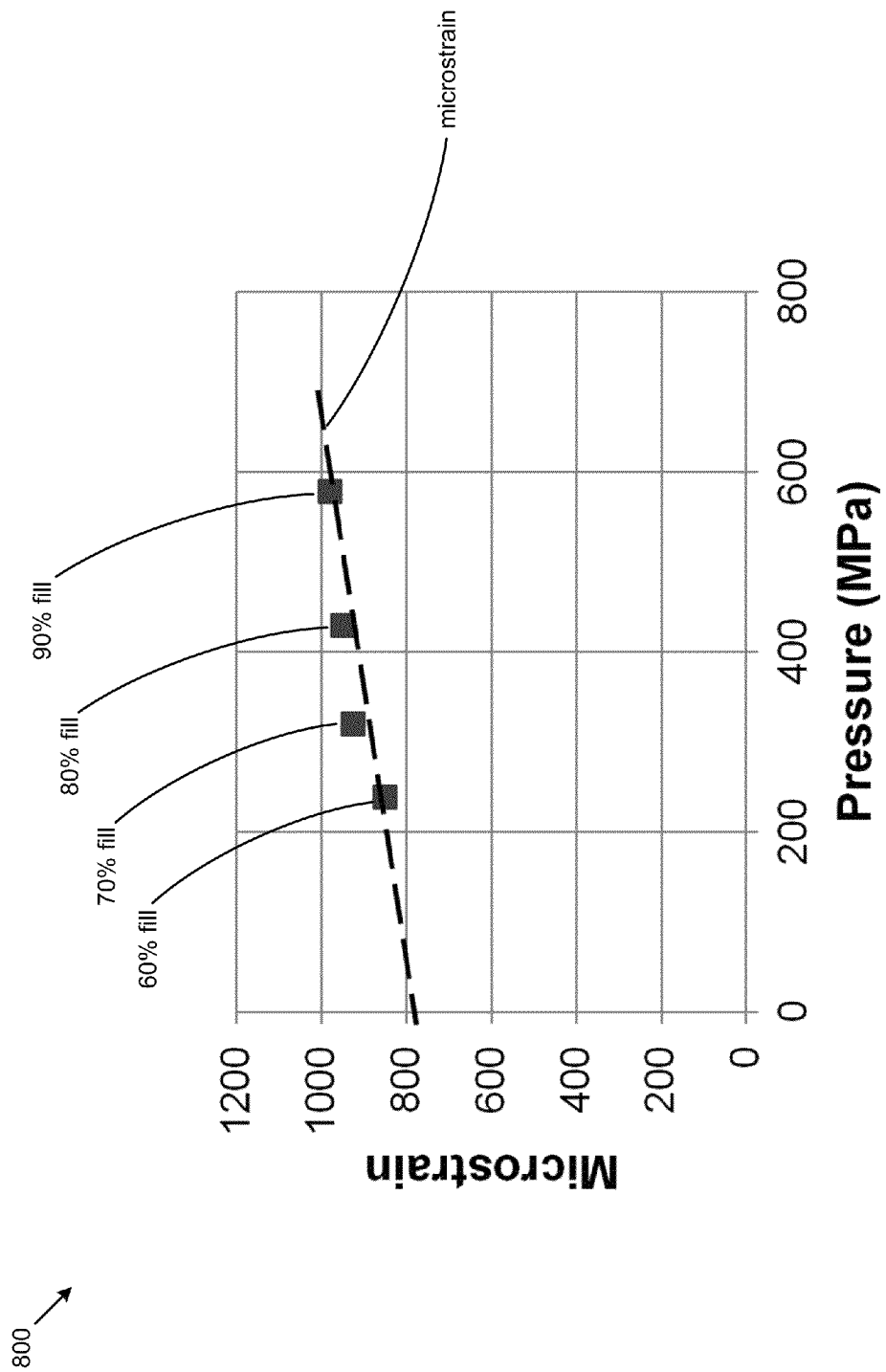
FIG. 8 is a graph showing the variation in microstrain at the outer diameter of a high strength enclosure with internal pressure of ammonia in a capsule, according to some embodiments.

For each % fill value, the pressure of ammonia was calculated by extrapolation of the data in the Thermochemical Properties of Fluid Systems Database provided by the U.S. National Institute for Standards and Technology, (http://webbook.nist.gov/chemistry/fluid/). A finite element model (FEM) of the internally-heated high pressure apparatus was assembled, using literature values for the heater and for all the materials within the reactor, and the microstrain was calculated for each of the experiments that was performed. The results are summarized in Table 2 below and in the chart 800 of FIG. 8. The agreement between measured and calculated microstrains is excellent, indicating that the FEM is able to describe the stress/strain state of the components of the internally-heated high pressure apparatus accurately. Extrapolating the data to internal capsule pressure, as shown by the dashed line in FIG. 8, it is seen that a substantial fraction of the microstrain in the high strength enclosure is due to thermal components alone, such as restraint of the thermal expansion of the relatively close-fitting heater.

TABLE 2

Calculated internal ammonia pressure, measured temperature of the outer diameter of the high strength enclosure, measured microstrain, calculated microstrain, and percent error for ammonia heated to a temperature of approximately 700 degrees Celsius at initial fill percentages between 60% and 90%

| Fill % | Pressure (MPa) | OD temperature (° C.) | $\epsilon \times 10^6$ (experiment) | $\epsilon \times 10^6$ (FEM) | % error |
|---|---|---|---|---|---|
| 60% | 242 | 80.0 | 845 | 842 | 0.4% |
| | 324 | 74.5 | 918 | 867 | 5.6% |
| | 433 | 65.2 | 942 | 903 | 4.1% |
| | 579 | 73.3 | 977 | 920 | 5.9% |

Example 2

A heater, comprising Inconel 718, with an inner diameter of approximately 1.020 inch and an outer diameter of approximately 1.495 inch was placed within an internally heated high pressure apparatus comprising an annular ceramic member with an inner diameter of approximately 1.501 inch and a temperature-compensated strain gauge on the outer diameter of a high strength enclosure. The annular gap was thus approximately 0.006 inch, or approximately 0.4%. The annular gap between the outer diameter of the heater and the inner diameter of the radial heater restraint (the annular ceramic member) was designed to produce load-bearing contact at a heater temperature between about 250 degrees Celsius and about 300 degrees Celsius. A series of gallium nitride crystal growth experiments, at ammonia fill values between about 60% and about 90% were performed at temperatures between about 650 degrees Celsius and about 700 degrees Celsius, and the temperature and microstrain of the outer diameter of the high strength enclosure were recorded. The results were compared to results obtained under approximately identical conditions but with a heater with an annular gap similar to that of Example 1, where the annular gap between the heater and the radial heater restraint was sufficient for assembly but no more. The measured microstrain in the apparatus with the engineered annular gap was approximately 50% lower than that with the small annular gap. Because of the power-law nature of the stress-life relationship for typical structure metals, we anticipate that this reduced stress level in the high strength enclosure can result in more than a doubling of reactor lifetime.

Figure 9:
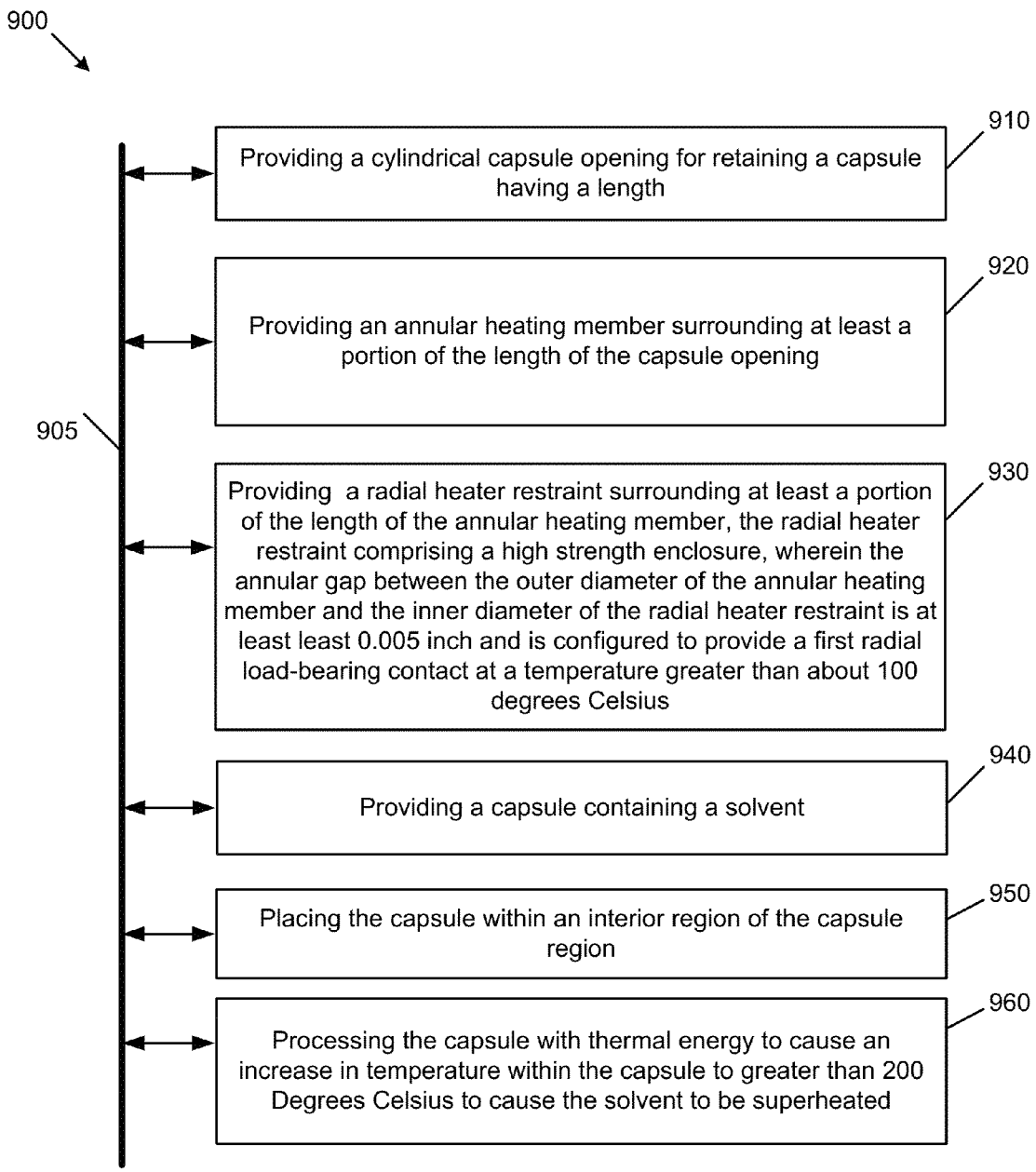
FIG. 9 depicts a block diagram of a system for carrying out method steps, according to some embodiments.

FIG. 9 depicts a block diagram of a system for carrying out method steps. As an option, the present system 900 may be implemented in the context of the architecture and functionality of the embodiments described herein. Of course, however, the system 900 or any operation therein may be carried out in any desired environment. As shown, an operation can be implemented in whole or in part using program instructions accessible by a module. The modules are connected to a communication path 905, and any operation can communicate with other operations over communication path 905. The modules of the system can, individually or in combination, perform method operations within system 900. Any operations performed within system 900 may be performed in any order unless as may be specified in the claims. The embodiment of FIG. 9 implements modules for: providing an apparatus for high pressure crystal or material processing, the apparatus comprising a cylindrical capsule opening for retaining a capsule having a length (see module 910); an annular heating member surrounding at least a portion of the length of the capsule opening (see module 920); and a radial heater restraint surrounding at least a portion of the length of the annular heating member, the radial heater restraint comprising a high strength enclosure, wherein the annular gap between the outer diameter of the annular heating member and the inner diameter of the radial heater restraint is at least 0.005 inch and is configured to provide a first radial load-bearing contact at a temperature not less than about 100 degrees Celsius (see module 930); providing a capsule containing a solvent (see module 940); placing the capsule within an interior region of the capsule region (see module 950); and processing the capsule with thermal energy to cause an increase in temperature within the capsule to greater than 200 Degrees Celsius to cause the solvent to be superheated (see module 960).

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. An apparatus for high pressure material processing comprising:
   a cylindrical capsule opening for retaining a capsule having a length;
   an annular heating member having a length and an outer diameter, and surrounding at least a portion of the length of the capsule opening;
   a radial heater restraint surrounding at least a portion of the length of the annular heating member, the radial heater restraint having an inner diameter and comprising a high strength enclosure; and
   an annular gap defined by the outer diameter of the annular heating member and the inner diameter of the radial heater restraint, wherein the annular gap is at least 0.005 inch at room temperature and is configured to provide a radial load-bearing contact between the annular heating member and the radial heater restraint at a temperature not less than about 100 degrees Celsius.

2. The apparatus of claim 1, wherein the radial heater restraint comprises at least one annular ceramic member disposed continuously around a perimeter of the annular heating member, the at least one annular ceramic member comprising a material having a compressive strength of at least about 0.5 GPa and a thermal conductivity of less than about 100 watts per meter-Kelvin, and the high strength enclosure surrounds the at least one annular ceramic member.

3. The apparatus of claim 1, wherein the radial heater restraint comprises at least two annular ceramic radial segments arranged sequentially and disposed continuously around a perimeter of the annular heating member, the at least two annular ceramic radial segments comprising a material having a compressive strength of at least about 0.5 GPa and a thermal conductivity of less than about 100 watts per meter-Kelvin, and wherein the high strength enclosure surrounds the at least two annular radial segments.

4. The apparatus of claim 1, further comprising a capsule disposed within the capsule, wherein the capsule comprises a material selected from gold, platinum, silver, palladium, rhodium, titanium, rhenium, copper, stainless steel, zirconium, tantalum, and an alloy of any of the foregoing.

5. The apparatus of claim 2, further comprising a cylindrical sleeve having an outer diameter disposed between the at least one annular ceramic member and the high strength enclosure, wherein the cylindrical sleeve comprises a material selected from stainless steel, iron, steel, iron alloy, nickel, nickel alloy, and a combination of any of the foregoing.

6. The apparatus of claim 5, wherein the outer diameter of the cylindrical sleeve is tapered from a first end to a second end opposite to the first end with a taper angle between about 0.1 and about 5 degrees.

7. The apparatus of claim 1, wherein the high strength enclosure has a length, an outer diameter, and an inner diameter, wherein
   an aspect ratio of the length to the inner diameter of the high strength enclosure is from about 2 to about 25;
   the inner diameter of the high strength enclosure is between about two inches and about fifty inches;
   the length of the high strength enclosure is between 6 inches and 500 inches; and
   the ratio between the outer diameter of the high strength enclosure and the inner diameter of the high strength enclosure is between 1.2 and 5.

8. The apparatus of claim 1, wherein the radial heater restraint contains at least one crack.

9. A method of crystal growth, the method comprising:
   providing an apparatus for high pressure crystal or material processing, the apparatus comprising:
      a cylindrical capsule opening for retaining a capsule having a length;
      an annular heating member having a length and an outer diameter, and surrounding at least a portion of the length of the capsule opening;
      a radial heater restraint surrounding at least a portion of the length of the annular heating member, the radial heater restraint comprising a high strength enclosure; and
      an annular gap defined by the outer diameter of the annular heating member and the inner diameter of the radial heater restraint, wherein the annular gap is at least 0.010 inch at room temperature and is configured to provide a radial load-bearing contact between the annular heating member and the radial heater restraint at a temperature not less than about 100 degrees Celsius;
   providing a capsule containing a solvent;
   placing the capsule within an interior region of the cylindrical capsule; and
   processing the capsule with thermal energy to cause an increase in temperature within the capsule to be greater than 200 Degrees Celsius and to cause the solvent to be superheated.

10. The method of claim 9, wherein the radial heater restraint comprises at least one annular ceramic member disposed continuously around a perimeter of the annular heating member, the at least one annular ceramic member comprising a material having a compressive strength of at least about 0.5 GPa and a thermal conductivity of less than about 100 watts per meter-Kelvin, and wherein the high strength enclosure surrounds the at least one annular ceramic member.

11. The method of claim 9, wherein the radial heater restraint comprises at least two annular ceramic radial segments arranged sequentially and disposed continuously around a perimeter of the annular heating member, the at least two annular ceramic radial segments comprising a material having a compressive strength of at least about 0.5 GPa and a thermal conductivity of less than about 100 watts per meter-Kelvin, and wherein the high strength enclosure surrounds the at least two annular ceramic radial segments.

12. The method of claim 9, further comprising forming or recrystallizing a crystalline material from a process of the superheated solvent.

13. The method of claim 12, wherein the crystalline material comprises gallium-containing nitride.

14. The method of claim 9, wherein the annular gap is configured to provide radial load-bearing contact at a temperature not less than about 200 degrees Celsius.

15. A method of crystal growth, the method comprising:
providing an apparatus for high pressure crystal or material processing, the apparatus comprising:
  a cylindrical capsule opening for retaining a capsule having a length;
  a metal capsule disposed within the capsule opening, wherein the metal capsule contains ammonia and a mineralizer;
  an annular heating member having a length and surrounding at least a portion of the length of the capsule opening; and
  a radial heater restraint surrounding at least a portion of the length of the annular heating member, the radial heater restraint comprising a high strength enclosure, the radial heater restraint comprising at least one crack;
providing a capsule containing a solvent;
placing the capsule within an interior region of the cylindrical capsule; and
processing the capsule with thermal energy to cause an increase in temperature within the capsule to greater than 200 Degrees Celsius and to cause the solvent to be superheated.

16. The method of claim 15, wherein the radial heater restraint comprises at least one annular ceramic member disposed continuously around a perimeter of the annular heating member, the at least one annular ceramic member comprising a material having a compressive strength of at least about 0.5 GPa and a thermal conductivity of less than about 100 watts per meter-Kelvin, and wherein the high strength enclosure surrounds the at least one annular ceramic member.

17. The method of claim 15, wherein the radial heater restraint comprises at least two annular ceramic radial segments arranged sequentially and disposed continuously around a perimeter of the annular heating member, the at least two annular ceramic radial segments comprising a material having a compressive strength of at least about 0.5 GPa and a thermal conductivity of less than about 100 watts per meter-Kelvin, and wherein the high strength enclosure surrounds the at least two annular ceramic radial segments.

18. The method of claim 15, wherein the crystal or material comprises gallium-containing nitride.

19. An apparatus for high pressure material processing comprising:
  a cylindrical capsule opening for retaining a capsule having a length;
  an annular heating member having a length and an outer diameter, and surrounding at least a portion of the length of the capsule opening;
  a radial heater restraint surrounding at least a portion of the length of the annular heating member, the radial heater restraint comprising a high strength enclosure; and
  an annular gap defined by the outer diameter of the annular heating member and the inner diameter of the radial heater restraint, wherein the width of the annular gap is selected to provide a first radial load-bearing contact between the annular heating member and the radial heater restraint at a temperature not less than about 100 degrees Celsius.

20. The apparatus of claim 19, wherein the radial heater restraint comprises at least one annular ceramic member disposed continuously around a perimeter of the annular heating member, the at least one annular ceramic member comprising a material having a compressive strength of at least about 0.5 GPa and a thermal conductivity of less than about 100 watts per meter-Kelvin, and wherein the high strength enclosure surrounds the at least one annular ceramic member.

* * * * *